(12) United States Patent
Chung et al.

(10) Patent No.: US 12,113,161 B2
(45) Date of Patent: Oct. 8, 2024

(54) DISPLAY DEVICE USING MICRO LED AND METHOD FOR MANUFACTURING SAME

(71) Applicant: LG ELECTRONICS INC., Seoul (KR)

(72) Inventors: Indo Chung, Seoul (KR); Jeonghyo Kwon, Seoul (KR); Dohan Kim, Seoul (KR)

(73) Assignee: LG ELECTRONICS INC., Seoul (KR)

(*) Notice: Subject to any disclaimer, the term of this patent is extended or adjusted under 35 U.S.C. 154(b) by 386 days.

(21) Appl. No.: 17/638,444

(22) PCT Filed: Aug. 30, 2019

(86) PCT No.: PCT/KR2019/011188
§ 371 (c)(1),
(2) Date: Feb. 25, 2022

(87) PCT Pub. No.: WO2021/040102
PCT Pub. Date: Mar. 4, 2021

(65) Prior Publication Data
US 2022/0352446 A1 Nov. 3, 2022

(30) Foreign Application Priority Data

Aug. 28, 2019 (KR) .......................... 10-2019-0105744

(51) Int. Cl.
*H01L 33/62* (2010.01)
*H01L 27/15* (2006.01)
(Continued)

(52) U.S. Cl.
CPC ............ *H01L 33/62* (2013.01); *H01L 27/156* (2013.01); *H01L 33/005* (2013.01);
(Continued)

(58) Field of Classification Search
None
See application file for complete search history.

(56) References Cited

U.S. PATENT DOCUMENTS

2005/0221524 A1* 10/2005 Hirai ................... H10K 71/13
438/30
2017/0236811 A1 8/2017 Pokhriyal et al.

FOREIGN PATENT DOCUMENTS

JP  2017120896 A * 7/2017 ....... H01L 21/28568
JP  2022164682 A * 10/2022 ......... H01L 25/0753
(Continued)

OTHER PUBLICATIONS

PCT International Application No. PCT/KR2019/011188, Written Opinion of the International Searching Authority dated May 26, 2020, 16 pages.
(Continued)

*Primary Examiner* — Michael Lebentritt
(74) *Attorney, Agent, or Firm* — LEE, HONG, DEGERMAN, KANG & WAIMEY

(57) ABSTRACT

The present specification provides a new type of a display device in which a wiring process is easily performed after a semiconductor light emitting element having a vertical structure is assembled on a substrate. Here, a semiconductor light emitting device according to an embodiment of the present invention is characterized by comprising: a substrate; a wiring electrode positioned on the substrate; a dielectric film positioned on the wiring electrode; an assembly electrode positioned on the dielectric film; an assembly
(Continued)

insulating film positioned on the assembly electrode; a partition wall positioned on the assembly insulting film and defining an assembly groove to which a semiconductor light emitting element is assembled; and the semiconductor light emitting element which is assembled to the assembly groove and provided with conductive electrodes on both ends thereof, wherein the wiring electrode is provided with a protrusion portion, and the protrusion portion protrudes toward the assembly groove and is electrically connected to the conductive electrode on one end of the semiconductor light emitting element.

16 Claims, 24 Drawing Sheets

(51) Int. Cl.
      *H01L 33/00*        (2010.01)
      *H01L 33/38*        (2010.01)

(52) U.S. Cl.
      CPC .... *H01L 33/382* (2013.01); *H01L 2933/0016* (2013.01); *H01L 2933/0066* (2013.01)

(56) References Cited

FOREIGN PATENT DOCUMENTS

| | | | |
|---|---|---|---|
| KR | 1020010064618 | 7/2001 | |
| KR | 1020110138757 | 12/2011 | |
| KR | 1020130033450 | 4/2013 | |
| KR | 1020170048971 | 5/2017 | |
| KR | 1020180082003 | 7/2018 | |
| KR | 1020190042130 | 4/2019 | |
| KR | 1020190075869 | 7/2019 | |
| KR | 1020190096474 | 8/2019 | |
| WO | WO-2014084012 A1 * | 6/2014 | ........... G02B 5/0242 |

OTHER PUBLICATIONS

European Patent Office Application Serial No. 19943294.9, Search Report dated Sep. 4, 2023, 8 pages.
Korean Intellectual Property Office Application No. 10-2019-0105744, Office Action dated Mar. 28, 2024, 7 pages.

* cited by examiner

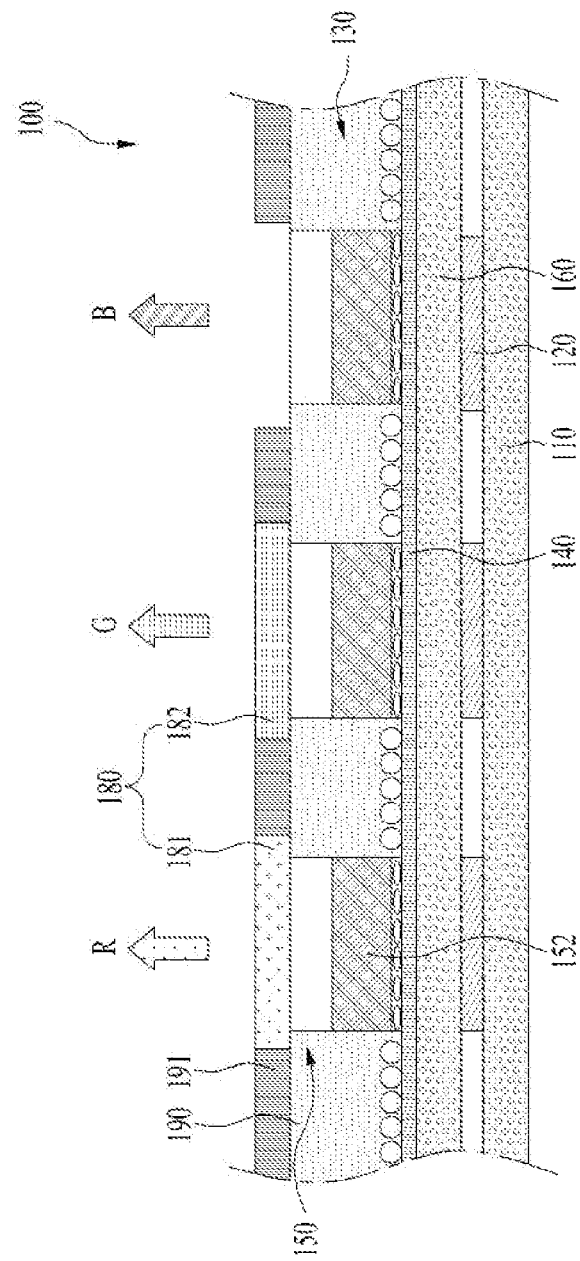

DISPLAY DEVICE USING MICRO LED AND METHOD FOR MANUFACTURING SAME

CROSS-REFERENCE TO RELATED APPLICATIONS

This application is the National Stage filing under 35 U.S.C. 371 of International Application No. PCT/KR2019/011188, filed on Aug. 30, 2019, which claims the benefit of earlier filing date and right of priority to Korean Application No. 10-2019-0105744, filed on Aug. 28, 2019, the contents of which are all hereby incorporated by reference herein their entirety.

TECHNICAL FIELD

The present disclosure is applicable to the display device related technical fields and relates to a display device using a micro Light Emitting Diode (LED) and method for manufacturing the same.

BACKGROUND ART

Recently, in a field of a display technology, display devices having excellent characteristics such as thinness, flexibility, and the like have been developed. On the other hand, currently commercialized major displays are represented by a LCD (liquid crystal display) and an OLED (organic light emitting diode).

However, the LCD has a response time that is not fast, and is difficult to be flexibly implemented.

On the other hand, LED (light emitting diode), which is a well-known semiconductor light-emitting element that converts electric current into light, has been used as a light source for a display image of an electronic device including an information and communication device along with a GaP:N-based green LED, starting with commercialization of a red LED using a GaAsP compound semiconductor in 1962. Accordingly, a method for solving the above-described problems by implementing a display using the semiconductor light-emitting element may be proposed. Such light emitting diode has various advantages, such as long lifespan, low power consumption, excellent initial driving characteristics, high vibration resistance, and the like, compared to a filament-based light-emitting element.

In order to implement a display device using these semiconductor light emitting elements, a large number of semiconductor light emitting elements is required. Therefore, in consideration of manufacturing cost, the size of the individual semiconductor light emitting elements should be reduced so as to increase the number of semiconductor light emitting elements produced on a substrate having a given area.

Therefore, development of semiconductor light emitting elements having a vertical structure rather than a horizontal structure is required. However, the semiconductor light emitting element having the vertical structure is disadvantageous in that it is difficult to perform a wiring process for electrical connection to a substrate.

DISCLOSURE

Technical Task

One technical task of one aspect of the present disclosure is to provide a display device using a semiconductor light emitting element and a method for manufacturing the same.

Another technical task of one aspect of the present disclosure is to provide a new type of display device in which a wiring process is easily performed after a semiconductor light emitting element having a vertical structure is assembled on a substrate.

Yet another technical task of one aspect of the present disclosure is to solve various problems not mentioned herein. Those skilled in the art may understand it through the full text of the specification and drawings.

Technical Solutions

In order to accomplish the above and other tasks, a display device using a semiconductor light emitting element according to one aspect of the present disclosure includes a substrate, a wiring substrate located on the substrate, a dielectric film located on the wiring electrode, assembly electrodes located on the dielectric film, an assembly insulating film located on the assembly electrodes, a partition wall located on the assembly insulating film so as to define an assembly recess configured such that the semiconductor light emitting element is assembled therewith, and the semiconductor light emitting element provided with conductivity-type electrodes formed at both ends thereof, and assembled with the assembly recess, wherein the wiring electrodes is provided with a protrusion, and the protrusion protrudes towards the assembly recess and is electrically connected to a conductivity-type electrode provided at one end of the semiconductor light emitting element.

A depression corresponding to a protruding extent of the protrusion may be formed in the wiring electrode under the protrusion.

The assembly electrodes may be provided in a pair and overlap the partition wall, and the wiring electrode may be located to overlap a center of the assembly recess.

The wiring electrode and the assembly electrodes may be provided in a bar type, and the wiring electrode and the assembly electrodes are formed parallel to each other in a direction of long axes of the bar-type electrodes.

Stepped parts configured such that the semiconductor light emitting element is placed thereon may be located under the assembly recess.

The stepped parts may be formed to be located in a direction from the partition wall towards an inside of the assembly recess by etching some parts of the dielectric film and the assembly insulating film.

The protrusion of the wiring electrode may be located in a space inside the assembly recess other than the stepped parts.

The surface of the conductivity-type electrode of the semiconductor light emitting element connected to the protrusion of the wiring electrode may be provided with an uneven structure.

The semiconductor light emitting element may be provided with a magnetic layer.

The semiconductor light emitting element may be a micro-LED having a size measured in micrometers.

A method for manufacturing a display device using a plurality of semiconductor light emitting elements according to another aspect of the present disclosure includes forming the semiconductor light emitting elements provided with a magnetic layer, preparing an assembly substrate including wiring electrodes, assembly electrodes and assembly recesses, putting the semiconductor light emitting elements into a chamber filled with a fluid, locating the assembly substrate on an upper surface of the chamber and assembling the semiconductor light emitting elements with the assembly recesses of the assembly substrate using a magnetic field and an electric field, locally radiating a laser to some regions of the wiring electrodes of the assembly substrate, and electrically connecting the regions of the wiring electrodes melted by the laser to the semiconductor light emitting elements.

The preparing the assembly substrate may include forming the wiring electrodes on a substrate, forming a dielectric film configured to surround the wiring electrodes, forming the assembly electrodes on the dielectric film, forming an assembly insulating film configured to surround the assembly electrodes, and forming a partition wall configured to define the assembly recesses on the assembly insulating film.

The method may further include forming stepped parts under the assembly recesses by etching some regions of the assembly insulating film and the dielectric film in which the partition wall is not located.

The assembling the semiconductor light emitting elements with the assembly recesses may include placing the semiconductor light emitting elements on upper surfaces of the stepped parts located under the assembly recesses.

The substrate may be formed of a material configured to transmit the laser, and the radiating the laser may include radiating the laser to a rear surface of the substrate towards the wiring electrodes configured to overlap the assembly recesses.

The semiconductor light emitting elements may have a vertical semiconductor light emitting structure provided with conductivity-type electrodes provided at both ends thereof, and an uneven structure may be provided on a surface of at least one of the conductivity-type electrodes provided at both ends of the vertical semiconductor light emitting structure.

Advantageous Effects

According to one embodiment of the present disclosure, a display device using a semiconductor light emitting element and a method for manufacturing the same may be provided.

Specifically, stepped parts are formed under an assembly recess of an assembly substrate on which a vertical semiconductor light emitting element is assembled, and a wiring electrode is located under the stepped parts. The assembly substrate is formed of a material transmitting a laser, and a wiring process in which parts of the wiring electrode are melted by radiating the laser thereto and are thus electrically connected to the semiconductor light emitting element is performed after the semiconductor light emitting element is assembled on the substrate.

In general, in case of a vertical semiconductor light emitting element having electrode parts formed at both ends thereof, it is difficult to perform the wiring process, compared to a horizontal semiconductor light emitting element, but, according to the present disclosure, the wiring process may be easily performed.

Furthermore, according to another embodiment of the present disclosure, there are additional effects not mentioned herein. Those of ordinary skill in the art may understand it through the full text of the specification and drawings.

DESCRIPTION OF DRAWINGS

FIGS. 3A and 3B are cross-sectional diagrams taken along the cutting lines B-B and C-C in FIG. 2.

BEST MODE FOR DISCLOSURE

Reference will now be made in detail to embodiments of the present disclosure, examples of which are illustrated in the accompanying drawings. Wherever possible, the same reference numbers will be used throughout the drawings to refer to the same or like parts, and redundant description thereof will be omitted. As used herein, the suffixes "module" and "unit" are added or used interchangeably to facilitate preparation of this specification and are not intended to suggest distinct meanings or functions. In describing embodiments disclosed in this specification, relevant well-known technologies may not be described in detail in order not to obscure the subject matter of the embodiments disclosed in this specification. In addition, it should be noted that the accompanying drawings are only for easy understanding of the embodiments disclosed in the present specification, and should not be construed as limiting the technical spirit disclosed in the present specification.

Furthermore, although the drawings are separately described for simplicity, embodiments implemented by combining at least two or more drawings are also within the scope of the present disclosure.

In addition, when an element such as a layer, region or module is described as being "on" another element, it is to be understood that the element may be directly on the other element or there may be an intermediate element between them.

The display device described herein is a concept including all display devices that display information with a unit pixel or a set of unit pixels. Therefore, the display device may be applied not only to finished products but also to parts. For example, a panel corresponding to a part of a digital TV also independently corresponds to the display device in the present specification. The finished products include a mobile phone, a smartphone, a laptop, a digital broadcasting terminal, a personal digital assistant (PDA), a portable multimedia player (PMP), a navigation system, a slate PC, a tablet, an Ultrabook, a digital TV, a desktop computer, and the like.

However, it will be readily apparent to those skilled in the art that the configuration according to the embodiments described herein is applicable even to a new product that will be developed later as a display device.

In addition, the semiconductor light emitting element mentioned in this specification is a concept including an LED, a micro LED, and the like, and may be used interchangeably therewith.

Figure 1:
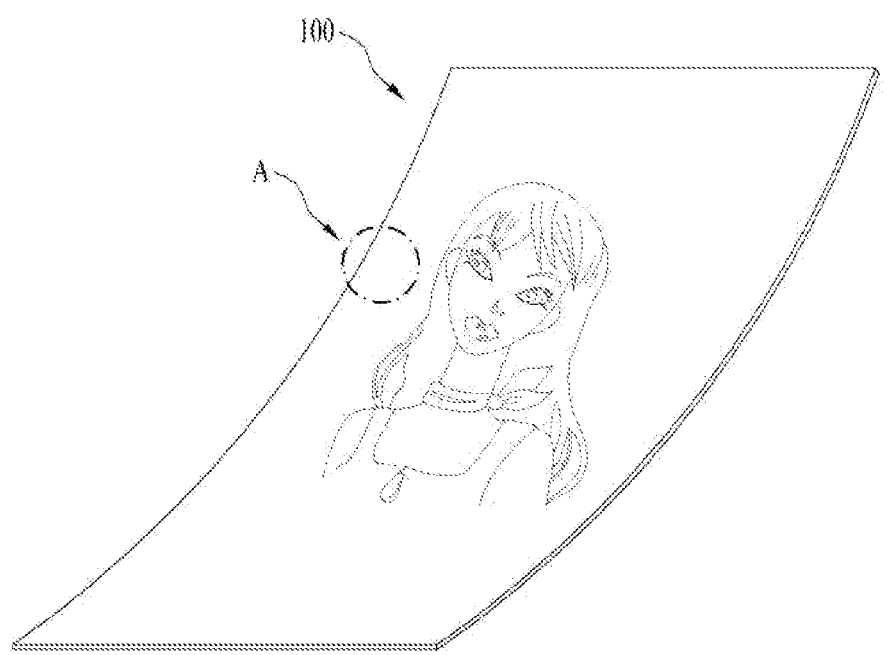
FIG. 1 is a conceptual diagram illustrating an embodiment of a display device using a semiconductor light emitting element according to the present disclosure.

FIG. 1 is a conceptual view illustrating an embodiment of a display device using a semiconductor light emitting element according to the present disclosure.

As shown in FIG. 1, information processed by a controller (not shown) of a display device 100 may be displayed using a flexible display.

The flexible display may include, for example, a display that can be warped, bent, twisted, folded, or rolled by external force.

Furthermore, the flexible display may be, for example, a display manufactured on a thin and flexible substrate that can be warped, bent, folded, or rolled like paper while maintaining the display characteristics of a conventional flat panel display.

When the flexible display remains in an unbent state (e.g., a state having an infinite radius of curvature) (hereinafter referred to as a first state), the display area of the flexible display forms a flat surface. When the display in the first state is changed to a bent state (e.g., a state having a finite radius of curvature) (hereinafter referred to as a second state) by external force, the display area may be a curved surface. As shown in FIG. 1, the information displayed in the second state may be visual information output on a curved surface. Such visual information may be implemented by independently controlling the light emission of sub-pixels arranged in a matrix form. The unit pixel may mean, for example, a minimum unit for implementing one color.

The unit pixel of the flexible display may be implemented by a semiconductor light emitting element. In the present disclosure, a light emitting diode (LED) is exemplified as a type of the semiconductor light emitting element configured to convert electric current into light. The LED may be formed in a small size, and may thus serve as a unit pixel even in the second state.

Hereinafter, a flexible display implemented using the LED will be described in more detail with reference to the drawings.

Figure 2:
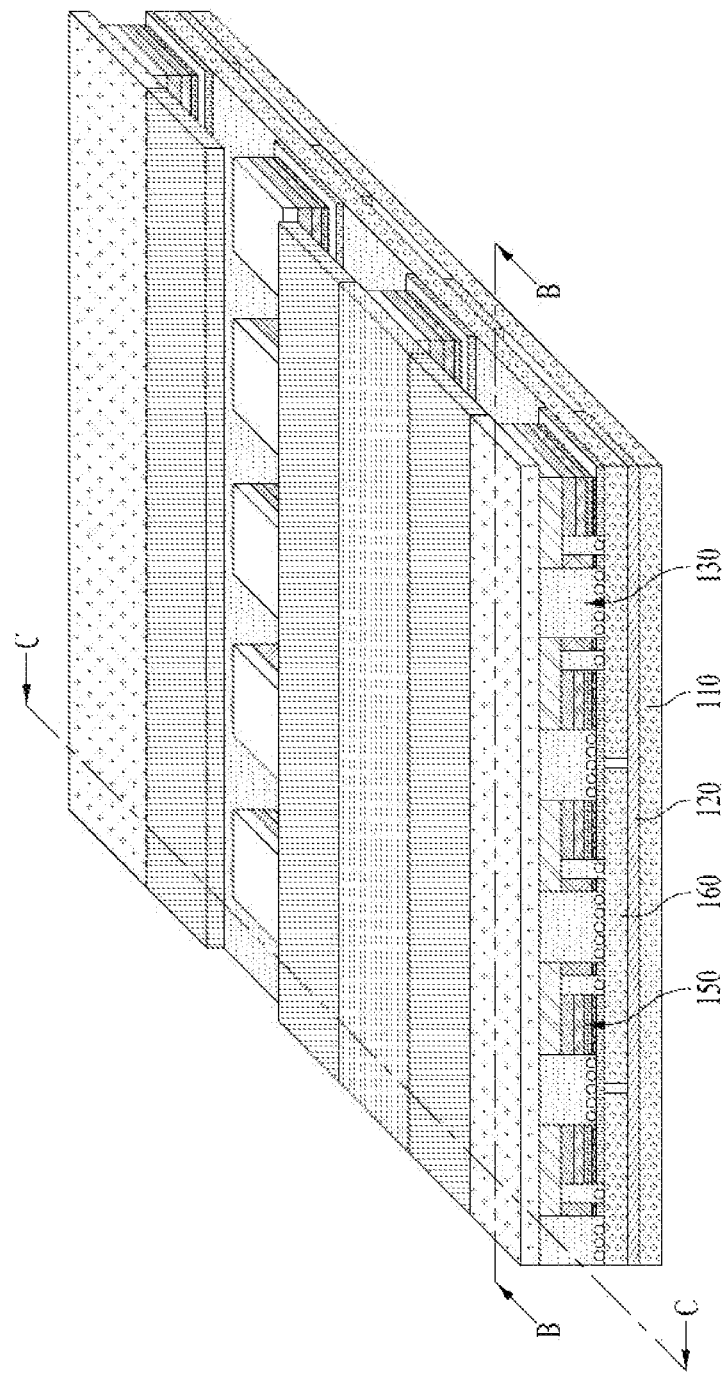
FIG. 2 is a partially enlarged diagram showing a part A shown in FIG. 1.

FIG. 2 is a partially enlarged view showing part A of FIG. 1.

Figure 3A:
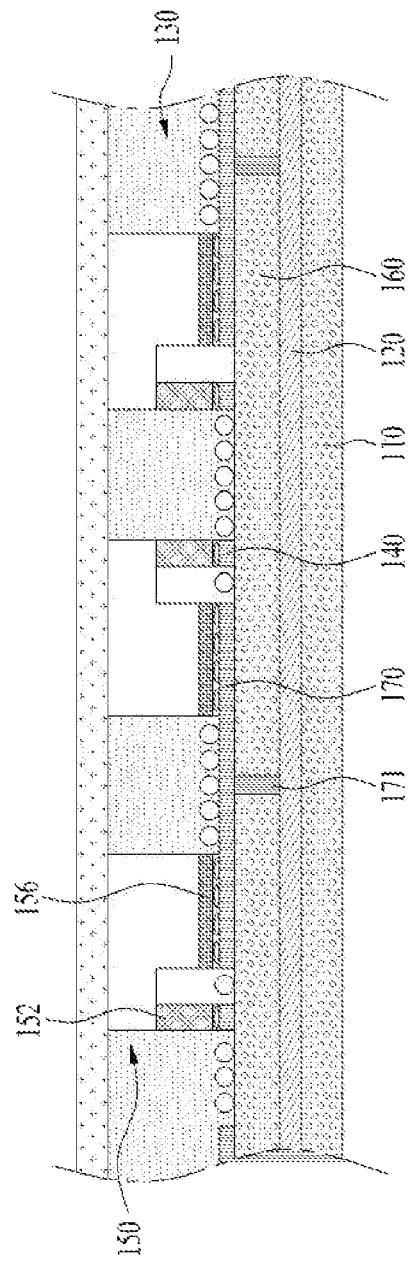

FIGS. 3A and 3B are cross-sectional views taken along lines B-B and C-C in FIG. 2.

Figure 4:
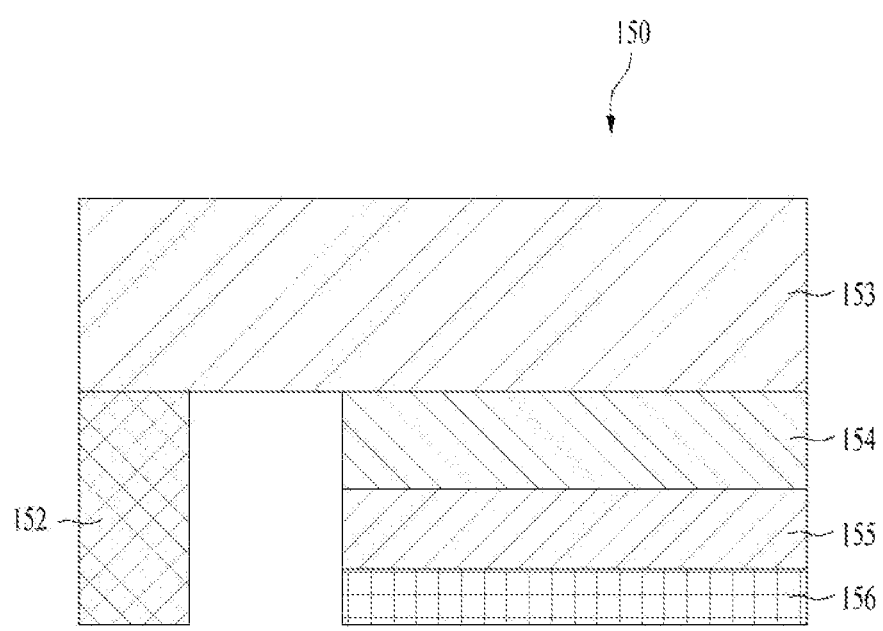
FIG. 4 is a conceptual diagram illustrating the flip-chip type semiconductor light emitting element of FIG. 3.

FIG. 4 is a conceptual view illustrating the flip-chip type semiconductor light emitting element of FIG. 3.

Figure 5A:
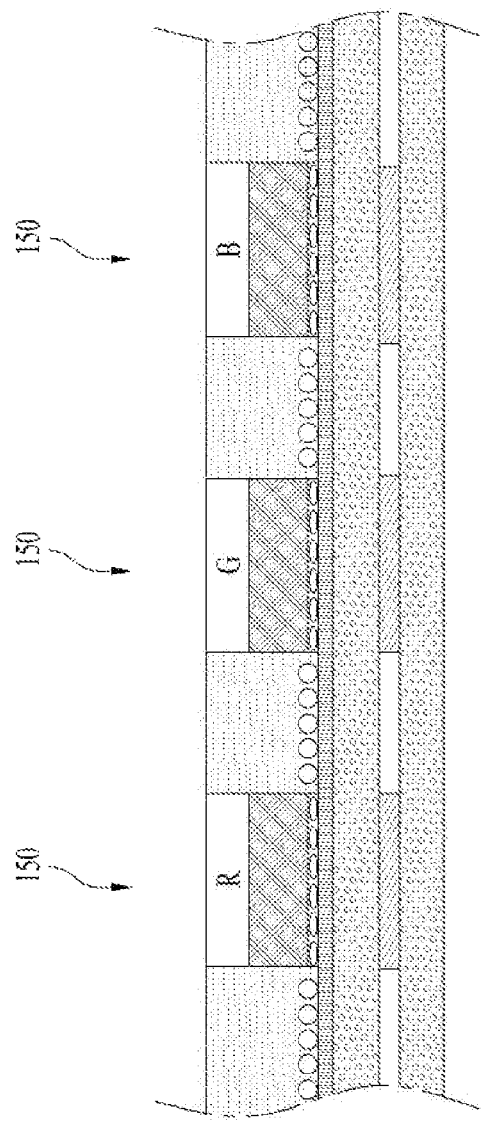
FIGS. 5A to 5C are conceptual diagrams illustrating various examples of color implementation with respect to a flip-chip type semiconductor light emitting element.
Figure 5B:
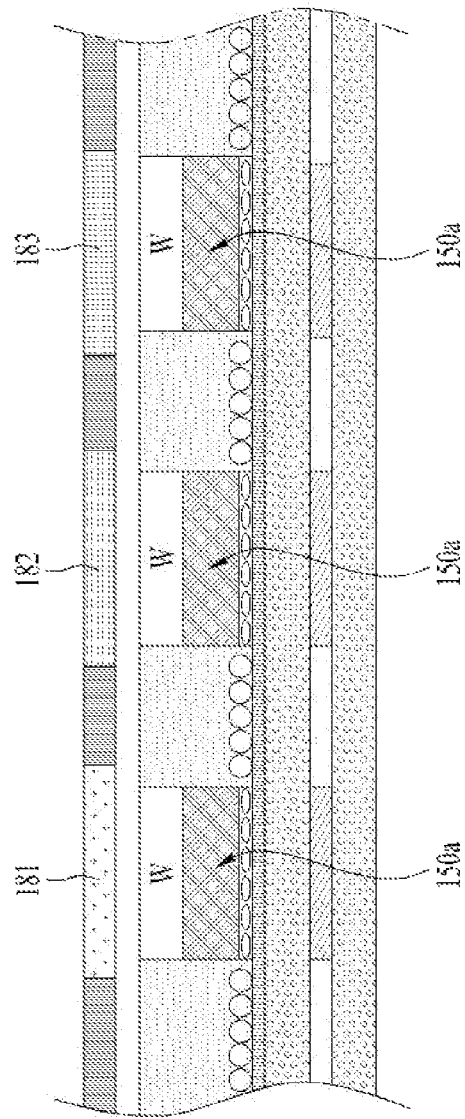
Figure 5C:
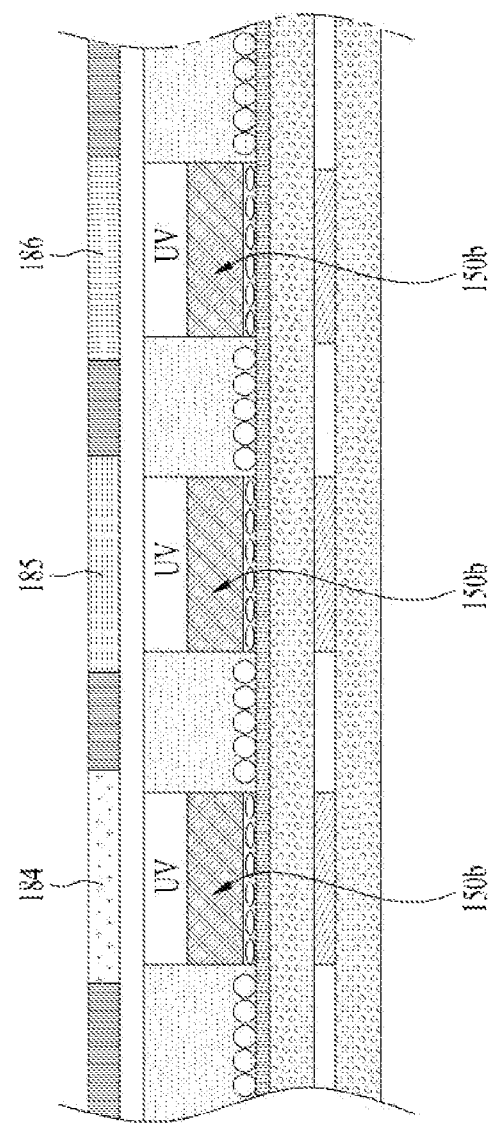

FIGS. 5A to 5C are conceptual views illustrating various examples of implementation of colors in relation to a flip-chip type semiconductor light emitting element.

As shown in FIGS. 2, 3A and 3B, the display device 100 using a passive matrix (PM) type semiconductor light emitting element is exemplified as the display device 100 using a semiconductor light emitting element. However, the examples described below are also applicable to an active matrix (AM) type semiconductor light emitting element.

The display device 100 shown in FIG. 1 may include a substrate 110, a first electrode 120, a conductive adhesive layer 130, a second electrode 140, and at least one semiconductor light emitting element 150, as shown in FIG. 2.

The substrate 110 may be a flexible substrate. For example, to implement a flexible display device, the substrate 110 may include glass or polyimide (PI). Any insulative and flexible material such as polyethylene naphthalate (PEN) or polyethylene terephthalate (PET) may be employed. In addition, the substrate 110 may be formed of either a transparent material or an opaque material.

The substrate 110 may be a wiring substrate on which the first electrode 120 is disposed. Thus, the first electrode 120 may be positioned on the substrate 110.

As shown in FIG. 3A, an insulating layer 160 may be disposed on the substrate 110 on which the first electrode 120 is positioned, and an auxiliary electrode 170 may be positioned on the insulating layer 160. In this case, a stack in which the insulating layer 160 is laminated on the substrate 110 may be a single wiring substrate. More specifically, the insulating layer 160 may be formed of an insulative and flexible material such as PI, PET, or PEN, and may be integrated with the substrate 110 to form a single substrate.

The auxiliary electrode 170, which is an electrode that electrically connects the first electrode 120 and the semiconductor light emitting element 150, is positioned on the insulating layer 160, and is disposed to correspond to the position of the first electrode 120. For example, the auxiliary electrode 170 may have a dot shape and may be electrically connected to the first electrode 120 by an electrode hole 171 formed through the insulating layer 160. The electrode hole 171 may be formed by filling a via hole with a conductive material.

As shown in FIG. 2 or 3A, a conductive adhesive layer 130 may be formed on one surface of the insulating layer 160, but embodiments of the present disclosure are not limited thereto. For example, a layer performing a specific function may be formed between the insulating layer 160 and the conductive adhesive layer 130, or the conductive adhesive layer 130 may be disposed on the substrate 110 without the insulating layer 160. In a structure in which the conductive adhesive layer 130 is disposed on the substrate 110, the conductive adhesive layer 130 may serve as an insulating layer.

The conductive adhesive layer 130 may be a layer having adhesiveness and conductivity. For this purpose, a material having conductivity and a material having adhesiveness may be mixed in the conductive adhesive layer 130. In addition, the conductive adhesive layer 130 may have ductility, thereby providing making the display device flexible.

As an example, the conductive adhesive layer 130 may be an anisotropic conductive film (ACF), an anisotropic conductive paste, a solution containing conductive particles, or the like. The conductive adhesive layer 130 may be configured as a layer that allows electrical interconnection in the direction of the Z-axis extending through the thickness, but is electrically insulative in the horizontal X-Y direction. Accordingly, the conductive adhesive layer 130 may be referred to as a Z-axis conductive layer (hereinafter, referred to simply as a "conductive adhesive layer").

The ACF is a film in which an anisotropic conductive medium is mixed with an insulating base member. When the ACF is subjected to heat and pressure, only a specific portion thereof becomes conductive by the anisotropic conductive medium. Hereinafter, it will be described that heat and pressure are applied to the ACF. However, another method may be used to make the ACF partially conductive. The other method may be, for example, application of only one of the heat and pressure or UV curing.

In addition, the anisotropic conductive medium may be, for example, conductive balls or conductive particles. For example, the ACF may be a film in which conductive balls are mixed with an insulating base member. Thus, when heat and pressure are applied to the ACF, only a specific portion of the ACF is allowed to be conductive by the conductive balls. The ACF may contain a plurality of particles formed by coating the core of a conductive material with an insulating film made of a polymer material. In this case, as the insulating film is destroyed in a portion to which heat and pressure are applied, the portion is made to be conductive by the core. At this time, the cores may be deformed to form layers that contact each other in the thickness direction of the film. As a more specific example, heat and pressure are applied to the whole ACF, and an electrical connection in the Z-axis direction is partially formed by the height difference of a counterpart adhered by the ACF.

As another example, the ACF may contain a plurality of particles formed by coating an insulating core with a conductive material. In this case, as the conductive material is deformed (pressed) in a portion to which heat and pressure are applied, the portion is made to be conductive in the thickness direction of the film. As another example, the conductive material may be disposed through the insulating base member in the Z-axis direction to provide conductivity in the thickness direction of the film. In this case, the conductive material may have a pointed end.

The ACF may be a fixed array ACF in which conductive balls are inserted into one surface of the insulating base member. More specifically, the insulating base member may be formed of an adhesive material, and the conductive balls may be intensively disposed on the bottom portion of the insulating base member. Thus, when the base member is subjected to heat and pressure, it may be deformed together with the conductive balls, exhibiting conductivity in the vertical direction.

However, the present disclosure is not necessarily limited thereto, and the ACF may be formed by randomly mixing conductive balls in the insulating base member, or may be composed of a plurality of layers with conductive balls arranged on one of the layers (as a double-ACF).

The anisotropic conductive paste may be a combination of a paste and conductive balls, and may be a paste in which conductive balls are mixed with an insulating and adhesive base material. Also, the solution containing conductive particles may be a solution containing any conductive particles or nanoparticles.

Referring back to FIG. 3A, the second electrode 140 is positioned on the insulating layer 160 and spaced apart from the auxiliary electrode 170. That is, the conductive adhesive layer 130 is disposed on the insulating layer 160 having the auxiliary electrode 170 and the second electrode 140 positioned thereon.

After the conductive adhesive layer 130 is formed with the auxiliary electrode 170 and the second electrode 140 positioned on the insulating layer 160, the semiconductor light emitting element 150 is connected thereto in a flip-chip form by applying heat and pressure. Thereby, the semiconductor light emitting element 150 is electrically connected to the first electrode 120 and the second electrode 140.

Referring to FIG. 4, the semiconductor light emitting element may be a flip chip-type light emitting device.

For example, the semiconductor light emitting element may include a p-type electrode 156, a p-type semiconductor layer 155 on which the p-type electrode 156 is formed, an active layer 154 formed on the p-type semiconductor layer 155, an n-type semiconductor layer 153 formed on the active layer 154, and an n-type electrode 152 disposed on the n-type semiconductor layer 153 and horizontally spaced apart from the p-type electrode 156. In this case, the p-type electrode 156 may be electrically connected to the auxiliary electrode 170, which is shown in FIG. 3, by the conductive adhesive layer 130, and the n-type electrode 152 may be electrically connected to the second electrode 140.

Referring back to FIGS. 2, 3A and 3B, the auxiliary electrode 170 may be elongated in one direction. Thus, one auxiliary electrode may be electrically connected to the plurality of semiconductor light emitting elements 150. For example, p-type electrodes of semiconductor light emitting elements on left and right sides of an auxiliary electrode may be electrically connected to one auxiliary electrode.

More specifically, the semiconductor light emitting element 150 may be press-fitted into the conductive adhesive layer 130 by heat and pressure. Thereby, only the portions of the semiconductor light emitting element 150 between the p-type electrode 156 and the auxiliary electrode 170 and between the n-type electrode 152 and the second electrode 140 may exhibit conductivity, and the other portions of the semiconductor light emitting element 150 do not exhibit conductivity as they are not press-fitted. In this way, the conductive adhesive layer 130 interconnects and electrically connects the semiconductor light emitting element 150 and the auxiliary electrode 170 and interconnects and electrically connects the semiconductor light emitting element 150 and the second electrode 140.

The plurality of semiconductor light emitting elements 150 may constitute a light emitting device array, and a phosphor conversion layer 180 may be formed on the light emitting device array.

The light emitting device array may include a plurality of semiconductor light emitting elements having different luminance values. Each semiconductor light emitting element 150 may constitute a unit pixel and may be electrically connected to the first electrode 120. For example, a plurality of first electrodes 120 may be provided, and the semiconductor light emitting elements may be arranged in, for example, several columns. The semiconductor light emitting elements in each column may be electrically connected to any one of the plurality of first electrodes.

In addition, since the semiconductor light emitting elements are connected in a flip-chip form, semiconductor light emitting elements grown on a transparent dielectric substrate may be used. The semiconductor light emitting elements may be, for example, nitride semiconductor light emitting elements. Since the semiconductor light emitting element 150 has excellent luminance, it may constitute an individual unit pixel even when it has a small size.

As shown in FIG. 3, a partition wall 190 may be formed between the semiconductor light emitting elements 150. In this case, the partition wall 190 may serve to separate individual unit pixels from each other, and may be integrated with the conductive adhesive layer 130. For example, by inserting the semiconductor light emitting element 150 into the ACF, the base member of the ACF may form the partition wall.

In addition, when the base member of the ACF is black, the partition wall 190 may have reflectance and increase contrast even without a separate black insulator.

As another example, a reflective partition wall may be separately provided as the partition wall 190. In this case, the partition wall 190 may include a black or white insulator depending on the purpose of the display device. When a partition wall including a white insulator is used, reflectivity may be increased. When a partition wall including a black insulator is used, it may have reflectance and increase contrast.

The phosphor conversion layer 180 may be positioned on the outer surface of the semiconductor light emitting element 150. For example, the semiconductor light emitting element 150 may be a blue semiconductor light emitting element that emits blue (B) light, and the phosphor conversion layer 180 may function to convert the blue (B) light into a color of a unit pixel. The phosphor conversion layer 180 may be a red phosphor 181 or a green phosphor 182 constituting an individual pixel.

That is, the red phosphor 181 capable of converting blue light into red (R) light may be laminated on a blue semiconductor light emitting element at a position of a unit pixel of red color, and the green phosphor 182 capable of converting blue light into green (G) light may be laminated on the blue semiconductor light emitting element at a position of a unit pixel of green color. Only the blue semiconductor light emitting element may be used alone in the portion constituting the unit pixel of blue color. In this case, unit pixels of red (R), green (G), and blue (B) may constitute one pixel. More specifically, a phosphor of one color may be laminated along each line of the first electrode 120. Accordingly, one line on the first electrode 120 may be an electrode for controlling one color. That is, red (R), green (G), and blue (B) may be sequentially disposed along the second electrode 140, thereby implementing a unit pixel.

However, embodiments of the present disclosure are not limited thereto. Unit pixels of red (R), green (G), and blue (B) may be implemented by combining the semiconductor light emitting element 150 and the quantum dot (QD) rather than using the phosphor.

Also, a black matrix 191 may be disposed between the phosphor conversion layers to improve contrast. That is, the black matrix 191 may improve contrast of light and darkness.

However, embodiments of the present disclosure are not limited thereto, and anther structure may be applied to implement blue, red, and green colors.

Referring to FIG. 5A, each semiconductor light emitting element may be implemented as a high-power light emitting device emitting light of various colors including blue by using gallium nitride (GaN) as a main material and adding indium (In) and/or aluminum (Al).

In this case, each semiconductor light emitting element may be a red, green, or blue semiconductor light emitting element to form a unit pixel (sub-pixel). For example, red, green, and blue semiconductor light emitting elements R, G, and B may be alternately disposed, and unit pixels of red, green, and blue may constitute one pixel by the red, green and blue semiconductor light emitting elements. Thereby, a full-color display may be implemented.

Referring to FIG. 5B, the semiconductor light emitting element 150a may include a white light emitting device W having a yellow phosphor conversion layer, which is provided for each device. In this case, in order to form a unit pixel, a red phosphor conversion layer 181, a green phosphor conversion layer 182, and a blue phosphor conversion layer 183 may be disposed on the white light emitting device W. In addition, a unit pixel may be formed using a color filter repeating red, green, and blue on the white light emitting device W.

Referring to FIG. 5C, a red phosphor conversion layer 181, a green phosphor conversion layer 185, and a blue phosphor conversion layer 183 may be provided on a ultraviolet light emitting device. Not only visible light but also ultraviolet (UV) light may be used in the entire region of the semiconductor light emitting element. In an embodiment, UV may be used as an excitation source of the upper phosphor in the semiconductor light emitting element.

Referring back to this example, the semiconductor light emitting element is positioned on the conductive adhesive layer to constitute a unit pixel in the display device. Since the semiconductor light emitting element has excellent luminance, individual unit pixels may be configured despite even when the semiconductor light emitting element has a small size.

Regarding the size of such an individual semiconductor light emitting element, the length of each side of the device may be, for example, 80 μm or less, and the device may have a rectangular or square shape. When the semiconductor light emitting element has a rectangular shape, the size thereof may be less than or equal to 20 μm×80 μm.

In addition, even when a square semiconductor light emitting element having a side length of 10 μm is used as a unit pixel, sufficient brightness to form a display device may be obtained.

Therefore, for example, in case of a rectangular pixel having a unit pixel size of 600 μm×300 μm (i.e., one side by the other side), a distance of a semiconductor light emitting element becomes sufficiently long relatively.

Thus, in this case, it is able to implement a flexible display device having high image quality over HD image quality.

The above-described display device using the semiconductor light emitting element may be prepared by a new fabricating method. Such a fabricating method will be described with reference to FIG. 6 as follows.

Figure 6:
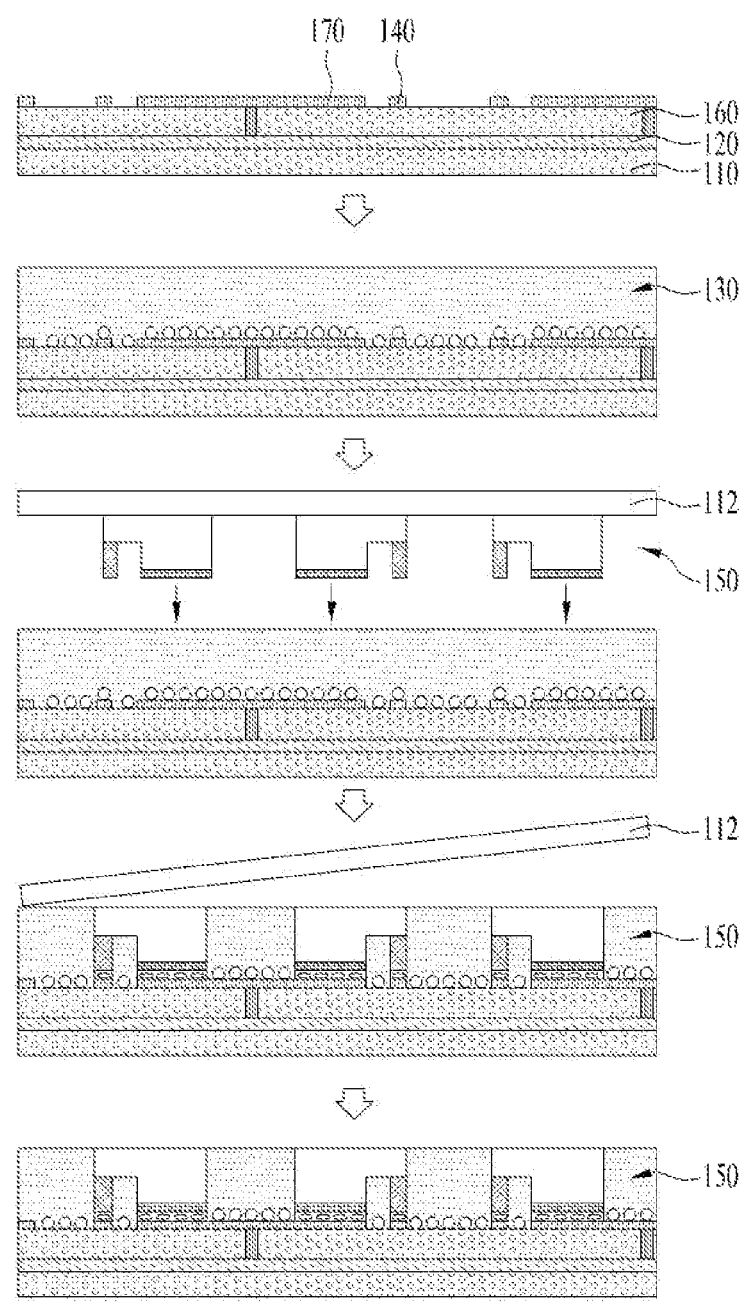
FIG. 6 shows cross-sectional views of a method of fabricating a display device using a semiconductor light emitting element according to the present disclosure.

FIG. 6 shows cross-sectional views of a method of fabricating a display device using a semiconductor light emitting element according to the present disclosure.

Referring to FIG. 6, first of all, a conductive adhesive layer 130 is formed on an insulating layer 160 located between an auxiliary electrode 170 and a second electrode 140. The insulating layer 160 is tacked on a wiring substrate 110. On the wiring substrate 110, a first electrode 120, the auxiliary electrode 170 and the second electrode 140 are disposed. In this case, the first electrode 120 and the second electrode 140 may be disposed in mutually orthogonal directions, respectively. In order to implement a flexible display device, the wiring substrate 110 and the insulating layer 160 may include glass or polyimide (PI) each.

For example, the conductive adhesive layer 130 may be implemented by an anisotropic conductive film. To this end, an anisotropic conductive film may be coated on the substrate on which the insulating layer 160 is located.

Subsequently, a temporary substrate 112, on which a plurality of semiconductor light emitting elements 150 configuring individual pixels are located to correspond to locations of the auxiliary electrode 170 and the second electrodes 140, is disposed in a manner that the semiconductor light emitting element 150 confronts the auxiliary electrode 170 and the second electrode 140.

In this regard, the temporary 112 substrate 112 is a growing substrate for growing the semiconductor light emitting element 150 and may include a sapphire or silicon substrate.

The semiconductor light emitting element is configured to have a space and size for configuring a display device when formed in unit of wafer, thereby being effectively used for the display device.

Subsequently, the wiring substrate 110 and the temporary substrate 112 are thermally compressed together. By the thermocompression, the wiring substrate 110 and the temporary substrate 112 are bonded together. Owing to the property of an anisotropic conductive film having conductivity by thermocompression, only a portion among the semiconductor light emitting element 150, the auxiliary electrode 170 and the second electrode 140 has conductivity, via which the electrodes and the semiconductor light emitting element 150 may be connected electrically. In this case, the semiconductor light emitting element 150 is inserted into the anisotropic conductive film, by which a partition may be formed between the semiconductor light emitting elements 150.

Then the temporary substrate 112 is removed. For example, the temporary substrate 112 may be removed using Laser Lift-Off (LLO) or Chemical Lift-Off (CLO).

Finally, by removing the temporary substrate 112, the semiconductor light emitting elements 150 exposed externally. If necessary, the wiring substrate 110 to which the semiconductor light emitting elements 150 are coupled may be coated with silicon oxide (SiOx) or the like to form a transparent insulating layer (not shown).

In addition, a step of forming a phosphor layer on one side of the semiconductor light emitting element 150 may be further included. For example, the semiconductor light emitting element 150 may include a blue semiconductor light emitting element emitting Blue (B) light, and a red or green phosphor for converting the blue (B) light into a color of a unit pixel may form a layer on one side of the blue semiconductor light emitting element.

The above-described fabricating method or structure of the display device using the semiconductor light emitting element may be modified into various forms. For example, the above-described display device may employ a vertical semiconductor light emitting element.

Furthermore, a modification or embodiment described in the following may use the same or similar reference numbers for the same or similar configurations of the former example and the former description may apply thereto.

Figure 7:
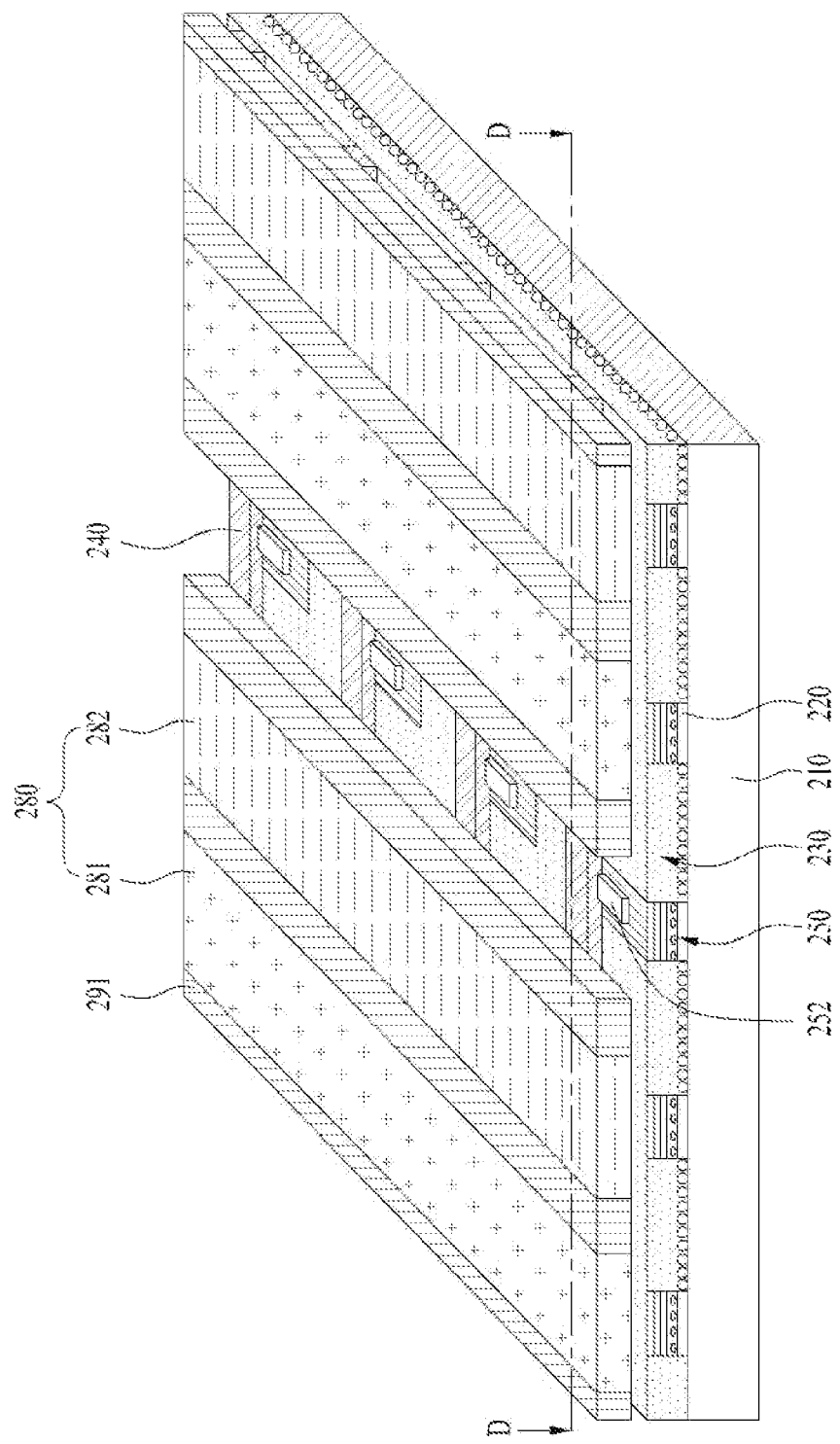
FIG. 7 is a perspective diagram of a display device using a semiconductor light emitting element according to another embodiment of the present disclosure.
Figure 8:
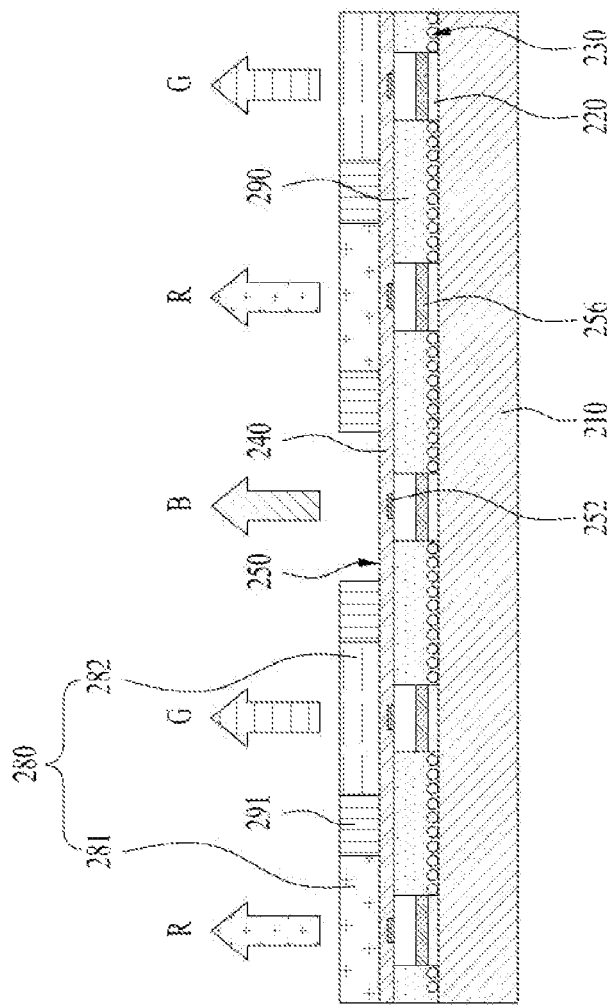
FIG. 8 is a cross-sectional diagram taken along a cutting line D-D shown in FIG. 8.
Figure 9:
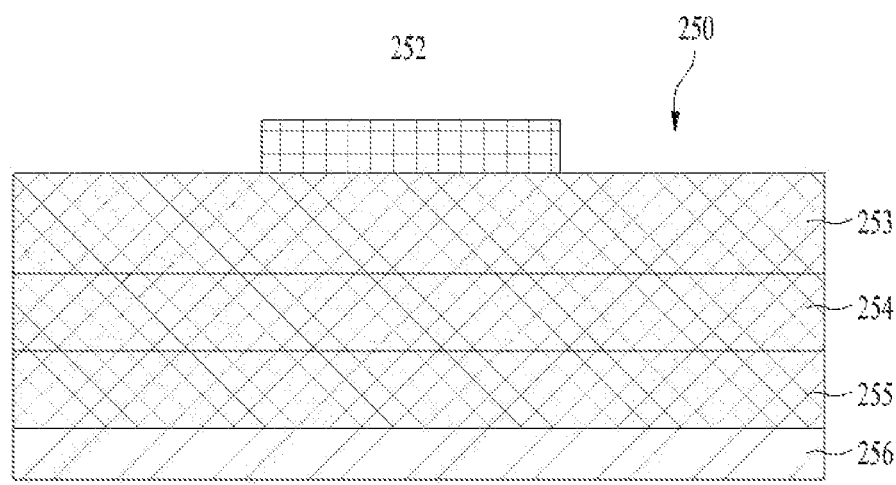
FIG. 9 is a conceptual diagram showing a vertical type semiconductor light emitting element shown in FIG. 8.

FIG. 7 is a perspective diagram of a display device using a semiconductor light emitting element according to another embodiment of the present disclosure, FIG. 8 is a cross-sectional diagram taken along a cutting line D-D shown in FIG. 8, and FIG. 9 is a conceptual diagram showing a vertical type semiconductor light emitting element shown in FIG. 8.

Referring to the present drawings, a display device may employ a vertical semiconductor light emitting device of a Passive Matrix (PM) type.

The display device includes a substrate 210, a first electrode 220, a conductive adhesive layer 230, a second electrode 240 and at least one semiconductor light emitting element 250.

The substrate 210 is a wiring substrate on which the first electrode 220 is disposed and may contain polyimide (PI) to implement a flexible display device. Besides, the substrate 210 may use any substance that is insulating and flexible.

The first electrode 210 is located on the substrate 210 and may be formed as a bar type electrode that is long in one direction. The first electrode 220 may be configured to play a role as a data electrode.

The conductive adhesive layer 230 is formed on the substrate 210 where the first electrode 220 is located. Like a display device to which a light emitting device of a flip chip type is applied, the conductive adhesive layer 230 may include one of an Anisotropic Conductive Film (ACF), an anisotropic conductive paste, a conductive particle contained solution and the like. Yet, in the present embodiment, a case of implementing the conductive adhesive layer 230 with the anisotropic conductive film is exemplified.

After the conductive adhesive layer has been placed in the state that the first electrode 220 is located on the substrate 210, if the semiconductor light emitting element 250 is connected by applying heat and pressure thereto, the semiconductor light emitting element 250 is electrically connected to the first electrode 220. In doing so, the semiconductor light emitting element 250 is preferably disposed to be located on the first electrode 220.

If heat and pressure is applied to an anisotropic conductive film, as described above, since the anisotropic conductive film has conductivity partially in a thickness direction, the electrical connection is established. Therefore, the anisotropic conductive film is partitioned into a conductive portion and a non-conductive portion.

Furthermore, since the anisotropic conductive film contains an adhesive component, the conductive adhesive layer 230 implements mechanical coupling between the semiconductor light emitting element 250 and the first electrode 220 as well as mechanical connection.

Thus, the semiconductor light emitting element 250 is located on the conductive adhesive layer 230, via which an individual pixel is configured in the display device. As the semiconductor light emitting element 250 has excellent luminance, an individual unit pixel may be configured in small size as well. Regarding a size of the individual semiconductor light emitting element 250, a length of one side may be equal to or smaller than 80 μm for example and the individual semiconductor light emitting element 250 may include a rectangular or square element. For example, the rectangular element may have a size equal to or smaller than 20 μm×80 μm.

The semiconductor light emitting element 250 may have a vertical structure.

Among the vertical type semiconductor light emitting elements, a plurality of second electrodes 240 respectively and electrically connected to the vertical type semiconductor light emitting elements 250 are located in a manner of being disposed in a direction crossing with a length direction of the first electrode 220.

Referring to FIG. 9, the vertical type semiconductor light emitting element 250 includes a p-type electrode 256, a p-type semiconductor layer 255 formed on the p-type electrode 256, an active layer 254 formed on the p-type semiconductor layer 255, an n-type semiconductor layer 253 formed on the active layer 254, and an n-type electrode 252 formed on then-type semiconductor layer 253. In this case, the p-type electrode 256 located on a bottom side may be electrically connected to the first electrode 220 by the conductive adhesive layer 230, and the n-type electrode 252 located on a top side may be electrically connected to a second electrode 240 described later. Since such a vertical type semiconductor light emitting element 250 can dispose the electrodes at top and bottom, it is considerably advantageous in reducing a chip size.

Referring to FIG. 8 again, a phosphor layer 280 may formed on one side of the semiconductor light emitting element 250. For example, the semiconductor light emitting element 250 may include a blue semiconductor light emitting element 251 emitting blue (B) light, and a phosphor layer 280 for converting the blue (B) light into a color of a unit pixel may be provided. In this regard, the phosphor layer 280 may include a red phosphor 281 and a green phosphor 282 configuring an individual pixel.

Namely, at a location of configuring a red unit pixel, the red phosphor 281 capable of converting blue light into red (R) light may be stacked on a blue semiconductor light emitting element. At a location of configuring a green unit pixel, the green phosphor 282 capable of converting blue light into green (G) light may be stacked on the blue semiconductor light emitting element. Moreover, the blue semiconductor light emitting element may be singly usable for a portion that configures a blue unit pixel. In this case, the unit pixels of red (R), green (G) and blue (B) may configure a single pixel.

Yet, the present disclosure is non-limited by the above description. In a display device to which a light emitting element of a flip chip type is applied, as described above, a different structure for implementing blue, red and green may be applicable.

Regarding the present embodiment again, the second electrode 240 is located between the semiconductor light emitting elements 250 and connected to the semiconductor light emitting elements electrically. For example, the semiconductor light emitting elements 250 are disposed in a plurality of columns, and the second electrode 240 may be located between the columns of the semiconductor light emitting elements 250.

Since a distance between the semiconductor light emitting elements 250 configuring the individual pixel is sufficiently long, the second electrode 240 may be located between the semiconductor light emitting elements 250.

The second electrode 240 may be formed as an electrode of a bar type that is long in one direction and disposed in a direction vertical to the first electrode.

In addition, the second electrode 240 and the semiconductor light emitting element 250 may be electrically connected to each other by a connecting electrode protruding from the second electrode 240. Particularly, the connecting electrode may include a n-type electrode of the semiconductor light emitting element 250. For example, the n-type electrode is formed as an ohmic electrode for ohmic contact, and the second electrode covers at least one portion of the ohmic electrode by printing or deposition. Thus, the second electrode 240 and the n-type electrode of the semiconductor light emitting element 250 may be electrically connected to each other.

Referring to FIG. 8 again, the second electrode 240 may be located on the conductive adhesive layer 230. In some cases, a transparent insulating layer (not shown) containing silicon oxide (SiOx) and the like may be formed on the substrate 210 having the semiconductor light emitting element 250 formed thereon. If the second electrode 240 is placed after the transparent insulating layer has been formed, the second electrode 240 is located on the transparent insulating layer. Alternatively, the second electrode 240 may be formed in a manner of being spaced apart from the conductive adhesive layer 230 or the transparent insulating layer.

If a transparent electrode of Indium Tin Oxide (ITO) or the like is sued to place the second electrode 240 on the semiconductor light emitting element 250, there is a problem that ITO substance has poor adhesiveness to an n-type semiconductor layer. Therefore, according to the present disclosure, as the second electrode 240 is placed between the semiconductor light emitting elements 250, it is advantageous in that a transparent electrode of ITO is not used. Thus, light extraction efficiency can be improved using a conductive substance having good adhesiveness to an n-type semiconductor layer as a horizontal electrode without restriction on transparent substance selection.

Referring to FIG. 8 again, a partition 290 may be located between the semiconductor light emitting elements 250. Namely, in order to isolate the semiconductor light emitting element 250 configuring the individual pixel, the partition 290 may be disposed between the vertical type semiconductor light emitting elements 250. In this case, the partition 290 may play a role in separating the individual unit pixels from each other and be formed with the conductive adhesive layer 230 as an integral part. For example, by inserting the semiconductor light emitting element 250 in an anisotropic conductive film, a base member of the anisotropic conductive film may form the partition.

In addition, if the base member of the anisotropic conductive film is black, the partition 290 may have reflective property as well as a contrast ratio may be increased, without a separate block insulator.

For another example, a reflective partition may be separately provided as the partition 190. The partition 290 may include a black or white insulator depending on the purpose of the display device.

In case that the second electrode 240 is located right onto the conductive adhesive layer 230 between the semiconductor light emitting elements 250, the partition 290 may be located between the vertical type semiconductor light emitting element 250 and the second electrode 240 each. Therefore, an individual unit pixel may be configured using the semiconductor light emitting element 250. Since a distance between the semiconductor light emitting elements 250 is sufficiently long, the second electrode 240 can be placed between the semiconductor light emitting elements 250. And, it may bring an effect of implementing a flexible display device having HD image quality.

In addition, as shown in FIG. 8, a black matrix 291 may be disposed between the respective phosphors for the contrast ratio improvement. Namely, the black matrix 291 may improve the contrast between light and shade.

Figure 10:
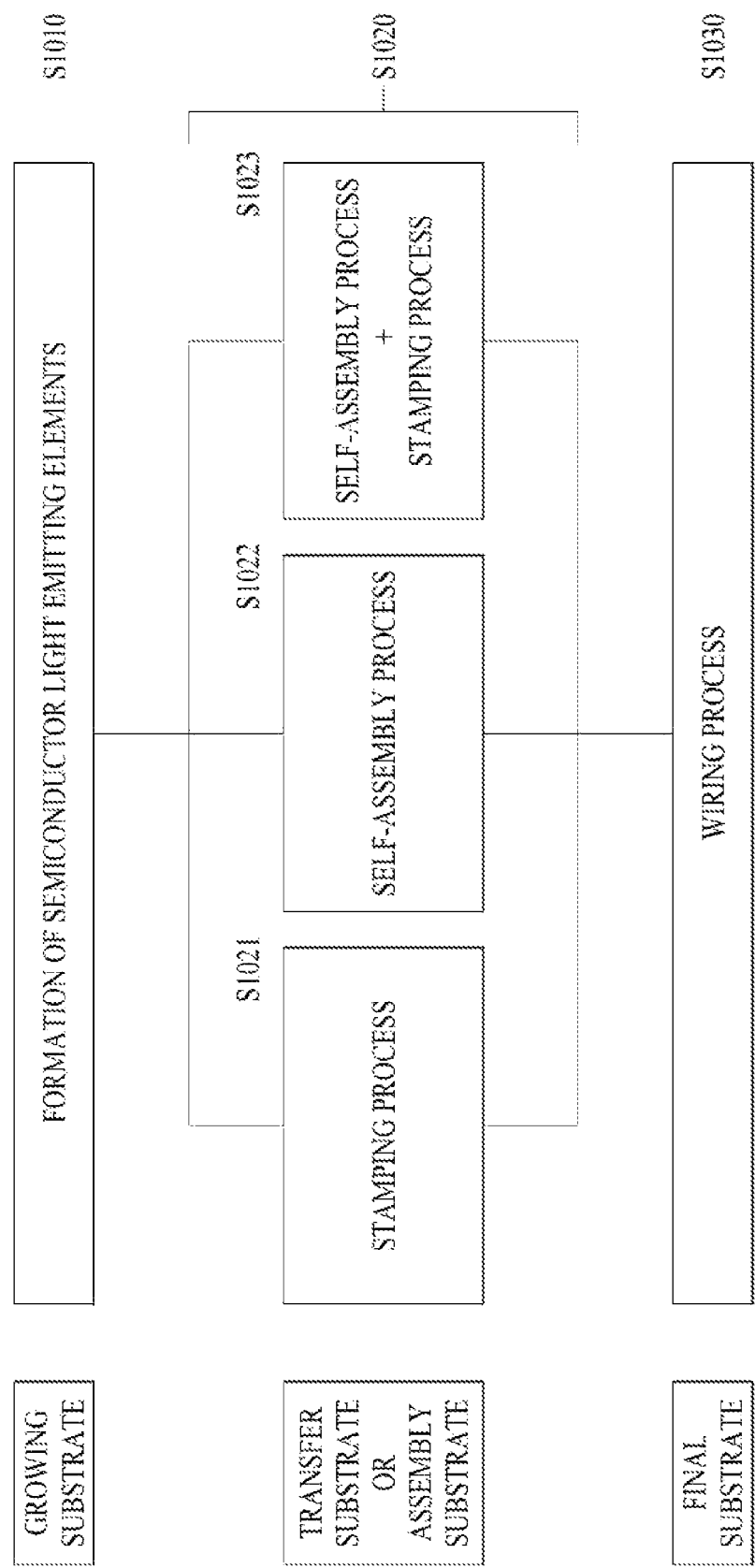
FIG. 10 is a flowchart schematically representing a method for manufacturing a display device using semiconductor light emitting elements.

FIG. 10 is a flowchart schematically representing a method for manufacturing a display device using a semiconductor light emitting element.

First, the semiconductor light emitting elements are formed on growth substrates (S1010). Each of the semiconductor light emitting elements may include a first conductivity-type semiconductor layer, an active layer and a second conductivity-type semiconductor layer. Each of the semiconductor light emitting elements may further include a first conductivity-type electrode formed on the first conductivity-type semiconductor layer and a second conductivity-type electrode formed on the second conductivity-type semiconductor layer.

The semiconductor light emitting elements may be horizontal semiconductor light emitting elements or vertical semiconductor light emitting elements. When the semiconductor light emitting elements are vertical semiconductor light emitting elements, the first conductivity-type electrode and the second conductivity-type electrode face each other, and thus, a process of separating the semiconductor light emitting elements from the growth substrate and then forming any one of the first and second conductivity-type electrodes in one direction is added. Further, as will be described later, the semiconductor light emitting elements may include a magnetic layer so as to perform the self-assembly process.

In order to apply the semiconductor light emitting elements to a display device, in general, three kinds of semiconductor light emitting elements configured to emit light of red (R), green (G) and blue (B) are necessary. Since semiconductor light emitting elements configured to emit light of one color are formed on one growth substrate, a separate substrate is required to manufacture the display device which implements respective unit pixels using the above three kinds of semiconductor light emitting elements. Therefore, the respective semiconductor light emitting elements need to be separated from the growth substrates and then be assembled on or transferred to a final substrate. The final substrate is a substrate on which a process of forming wiring electrodes applying voltage to the semiconductor light emitting elements so as to enable the semiconductor light emitting elements to emit light is performed.

Therefore, the semiconductor light emitting elements configured to emit light of respective colors may be primarily moved to a transfer substrate or an assembly substrate (S1020), and may be finally transferred to the final substrate. In some cases, when a wiring process is performed on the transfer substrate or the assembly substrate, the transfer substrate or the assembly substrate may serve as the final substrate.

The semiconductor light emitting elements may be arranged on the transfer substrate or the assembly substrate by the following three methods (S1020).

First, the semiconductor light emitting elements may be transferred from the growth substrate to the transfer substrate by a stamping process (S1021). The stamping process indicates a process in which semiconductor light emitting elements are separated from a growth substrate using a substrate which is formed of a flexible material and has adhesive protrusions, through the protrusions. The semiconductor light emitting elements may be selectively separated from the growth substrate by controlling the interval between the protrusions and the arrangement of the protrusions.

Second, the semiconductor light emitting elements may be assembled on the assembly substrate using the self-assembly process, as described above (S1022). In order to perform the self-assembly process, the semiconductor light emitting elements should be separated from the growth substrate so as to be prepared individually, and thus, a number of the semiconductor light emitting elements corresponding to the number needed is separated from the growth substrates through a Laser Lift Off (LLO) process. Thereafter, the semiconductor light emitting elements are dispersed in fluid, and are assembled on the assembly substrate using an electromagnetic field.

In the self-assembly process, the respective semiconductor light emitting elements configured to implement light of R, G and B may be simultaneously assembled on one assembly substrate, or the semiconductor light emitting elements configured to implement light of the respective colors may be assembled through respective assembly substrates.

Third, both the stamping process and the self-assembly process may be used (S1023). First, the semiconductor light emitting elements are located on the assembly substrate through the self-assembly process, and then, the semiconductor light emitting elements are transferred to the final substrate through the stamping process. Since it is difficult to implement a large-area assembly substrate due to the position of the assembly substrate disposed during the self-assembly process, contact with the fluid, the effect of the electromagnetic field, etc., the semiconductor light emitting elements may be assembled on the assembly substrate having an appropriate area and then the semiconductor light emitting elements on the assembly substrate are transferred to the final substrate having a large area plural times through the stamping process.

When the plurality of semiconductor light emitting elements configured to form respective unit pixels is arranged on the final substrate, the wiring process in which the semiconductor light emitting elements are electrically interconnected is performed (S1030).

Wiring electrodes formed through the wiring process electrically connect the semiconductor light emitting elements, assembled on or transferred to the substrate, to the substrate. Further, transistors configured to drive an active matrix may be formed in advance on the lower surface of the substrate. Therefore, the wiring electrodes may be electrically connected to the transistors.

In order to implement a large-scale display device, a large number of semiconductor light emitting elements is required, and thus, the self-assembly process is desirable. Further, in order to improve assembly speed, simultaneous assembly of the semiconductor light emitting elements configured to emit light of respective colors on one assembly substrate may be preferred during the self-assembly process. Further, in order to assemble the semiconductor light emitting elements configured to emit light of the respective colors with predetermined positions of the assembly substrate, the semiconductor light emitting elements may require mutually exclusive structures.

Figure 11:
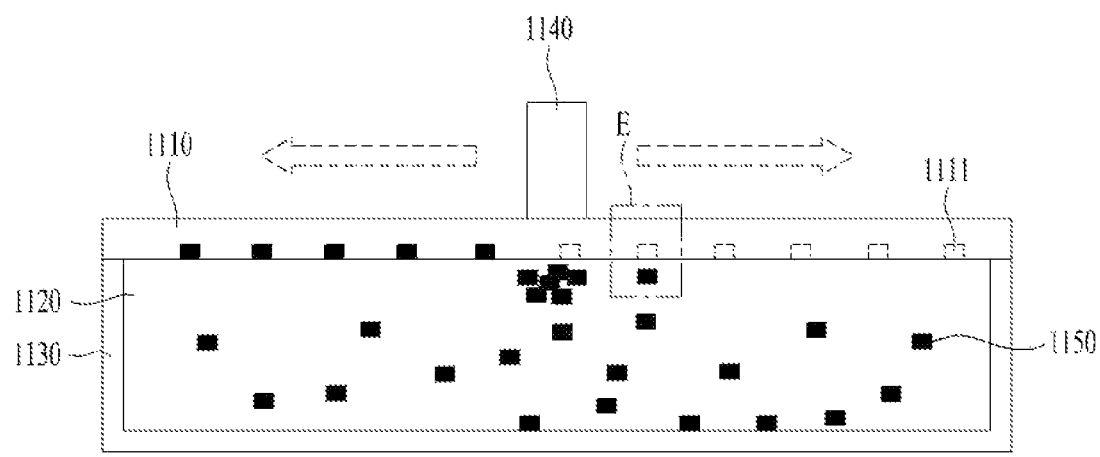
FIG. 11 is a diagram illustrating one embodiment of a method for assembling semiconductor light emitting elements on a substrate through a self-assembly process.

FIG. 11 is a diagram illustrating one embodiment of a method for assembling semiconductor light emitting elements on a substrate through the self-assembly process.

Figure 12:
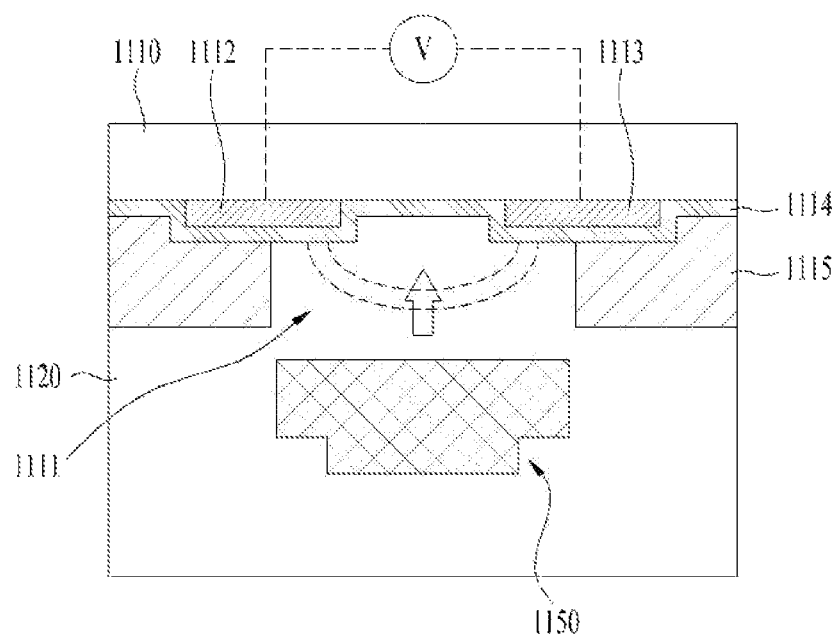
FIG. 12 is an enlarged diagram illustrating a part E shown in FIG. 11.

Further, FIG. 12 is an enlarged diagram illustrating a part E shown in FIG. 11.

Referring to FIGS. 11 and 12, semiconductor light emitting elements 1150 may be put into a chamber 1030 filled with a fluid 1020.

Thereafter, an assembly substrate 1110 may be placed on the chamber 1030. Depending on embodiments, the assembly substrate 1110 may be put into the chamber 1030. Here, the assembly substrate 1110 is put into the chamber 1030 in a direction in which assembly recesses 1111 of the assembly substrate 1110 face the fluid 1020.

A pair of electrodes 1112 and 1113 corresponding to each of the semiconductor light emitting elements 1150 to be assembled therewith may be formed on the assembly substrate 1110. The electrodes 1112 and 1113 may be implemented as transparent electrodes (formed of ITO), or may be implemented using other general materials. The electrodes 1112 and 1113 may generate an electric field by voltage applied thereto, and may thus correspond to assembly electrodes which stably fix the semiconductor light emitting element 1050 coming into contact with the assembly electrodes 1112 and 1113.

Specifically, AC voltage may be applied to the electrodes 1112 and 1113, and the semiconductor light emitting element 1150 floating around the electrodes 1112 and 1113 may have polarity due to dielectric polarization. Further, the dielectrically polarized semiconductor light emitting element 1150 may be moved or fixed in a specific direction by a non-uniform electric field formed around the electrodes 1112 and 1113. This may be referred to as dielectrophoresis and, during the self-assembly process according to the present disclosure, the semiconductor light emitting elements 1150 may be stably fixed to the assembly recesses 1111 using dielectrophoresis.

Further, the distance between the assembly electrodes 1112 and 1113 may be less than, for example, the width of the semiconductor light emitting elements 1150 and the diameter of the assembly recesses 1111, and the assembled positions of the semiconductor light emitting elements 1150 using an electric field may be more precisely fixed.

Further, an assembly insulating layer 1114 may be formed on the assembly electrodes 1112 and 1113, and may thus protect the electrodes 1112 and 1113 from the fluid 1020 and prevent leakage of current flowing in the assembly electrodes 1112 and 1113. For example, the assembly insulating layer 1114 may be formed as a single layer or multilayer structure using inorganic insulators, such as silica, alumina, etc., or organic insulators. In addition, the assembly insulating layer 1114 may have a minimum thickness so as to prevent damage to the assembly electrodes 1112 and 1113 when the semiconductor light emitting elements 1150 are assembled with the assembly electrodes 1112 and 1113, and may have a maximum thickness so as to stably assemble the semiconductor light emitting elements 1150.

A partition wall 1115 may be formed on the assembly insulting layer 1114. Some regions of the partition wall 1115 may be located on the assembly electrodes 1112 and 1113, and remaining regions may be located on the assembly substrate 1110.

For example, when the assembly substrate 1110 is manufactured, the assembly recesses 1111 through which the respective semiconductor light emitting elements 1150 are coupled to the assembly substrate 1110 may be formed by removing some parts of the partition wall 1115 formed on the entirety of the assembly insulating layer 1114.

As shown in FIG. 12, the assembly recesses 1111 to which the semiconductor light emitting elements 1150 are coupled may be formed on the assembly substrate 1110, and the surface of the assembly substrate 1110 on which the assembly recesses 1111 are formed may come into contact with the fluid 1120. The assembly recesses 1111 may accurately guide the semiconductor light emitting elements 1150 to the assembly positions thereof.

Further, the partition wall 1115 may be formed to have a designated inclination in a direction from the opening of the assembly recess 1111 to the bottom surface of the assembly recess 1111. For example, through control of the inclination of the partition wall 1115, the assembly recess 1111 may have the opening and the bottom surface, and the area of the opening may be greater than the area of the bottom surface. Thereby, the semiconductor light emitting element 1150 may be assembled with the accurate position on the bottom surface in the assembly recess 1111.

Each of the assembly recesses 1111 may have a shape and a size corresponding to the shape of a corresponding one of the semiconductor light emitting elements 1150 assembled therewith. Accordingly, assembly of other semiconductor light emitting elements with the assembly recesses 1111 or assembly of a plurality of semiconductor light emitting elements with one of the assembly recesses 1111 may be prevented.

Further, the depth of the assembly recesses 1111 may be less than the vertical height of the semiconductor light emitting elements 1150. Therefore, the semiconductor light emitting elements 1150 may protrude from the partition wall 1115, and may easily come into contact with protrusions of a transfer substrate during a transfer process after assembly.

Further, after the assembly substrate 1110 is disposed, as shown in FIG. 12, an assembly apparatus 1140 including a magnetic body may be moved along the assembly substrate 1110. The assembly apparatus 1140 may be moved in the state in which the assembly apparatus 1140 comes into contact with the assembly substrate 1110, so as to maximize a region, which a magnetic field affects, up to the inside of the fluid 1120. For example, the assembly apparatus 1140 may include a plurality of magnetic bodies, or may include a magnetic body having a size corresponding to the size of the assembly substrate 1110. In this case, the moving distance of the assembly apparatus 1140 may be restricted to within a designated range.

By the magnetic field generated by the assembly apparatus 1140, the semiconductor light emitting elements 1150 in the chamber 1110 may be moved towards the assembly apparatus 1140.

While the semiconductor light emitting elements 1150 are moved towards the assembly apparatus 1140, the semiconductor light emitting elements 1150 may enter the assembly recesses 1111, and may thus come into contact with the assembly substrate 1110, as shown in FIG. 12.

Further, the semiconductor light emitting elements 1150 may include a magnetic layer formed therein so as to perform the self-assembly process.

Due to the electric field generated by the assembly electrodes 1112 and 1113 of the assembly substrate 1110, release of the semiconductor light emitting elements 1150 coming into contact with the assembly substrate 1110 from the assembly substrate 1110 by movement of the assembly apparatus 1140 may be prevented.

Therefore, by the self-assembly method using an electromagnetic field, as shown in FIGS. 11 and 12, the plurality of semiconductor light emitting elements 1150 may be simultaneously assembled on the assembly substrate 1110.

Figure 13:
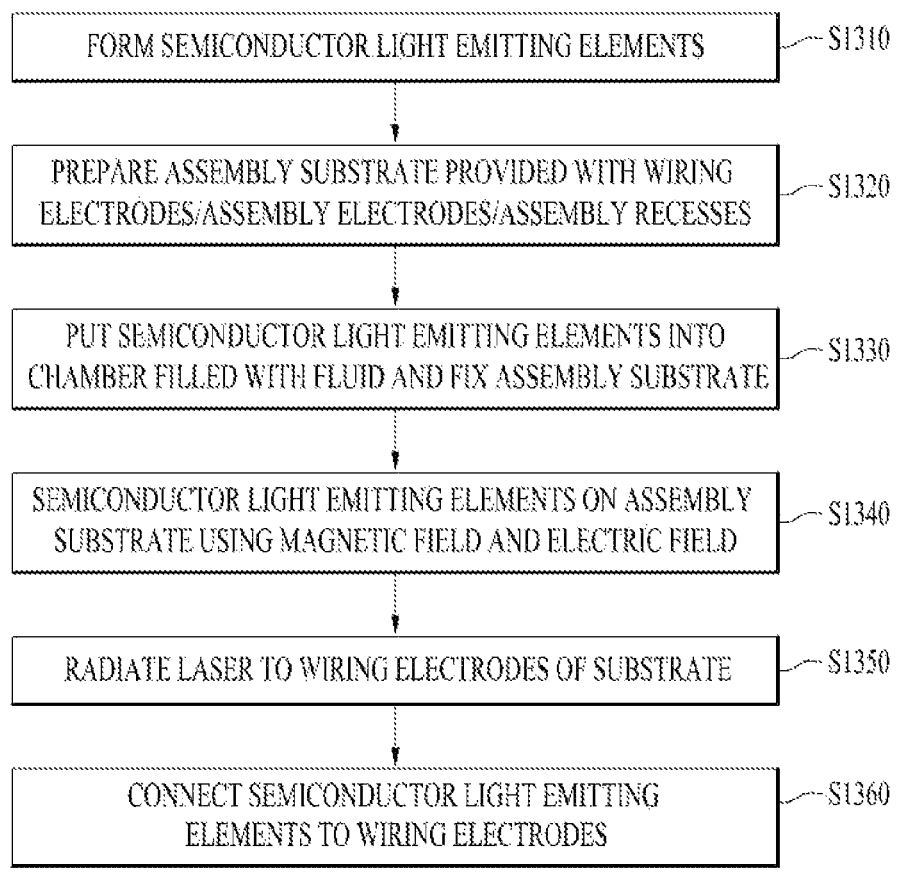
FIG. 13 is a flowchart schematically representing a method for manufacturing a display device using vertical semiconductor light emitting elements according to the present disclosure.

FIG. 13 is a flowchart schematically representing a method for manufacturing a display device using vertical semiconductor light emitting elements according to the present disclosure.

In case of a general horizontal semiconductor light emitting element, the element is assembled on a substrate by the self-assembly method described above in FIGS. 11 and 12, and thereafter, a process of forming wiring electrodes connected to respective conductivity-type electrodes on the element is performed.

However, in case of the vertical semiconductor light emitting element, conductivity-type electrodes are formed at both ends of the element, and thus, when the vertical semiconductor light emitting element is assembled on the substrate, only the conductivity-type electrode formed at one end of the element is exposed on the substrate. Therefore, a wiring process having reliability with respect to the unexposed conductivity-type electrode formed at the other end of the element is necessary, and the present disclosure discloses a display device in which the wiring process is easily performed even with respect to the unexposed conductivity-type electrode and a method for manufacturing the same.

First, semiconductor light emitting elements are formed on respective growth substrates (S1310). The semiconductor light emitting elements include a magnetic layer formed therein so as to perform self-assembly. The magnetic layer may be formed together with conductivity electrodes, and may be provided as a separate layer.

Since the semiconductor light emitting element is a semiconductor light emitting element having a vertical structure, in order to form the conductivity-type electrodes at both ends of the element, a process of separating a semiconductor light emitting structure having the conductivity-type electrode formed at one end thereof from the growth substrate should be performed first. During such a separation process, the stamping process may be performed, as described above, and thereafter, a process of forming the conductivity-type electrode on the separated surface of the semiconductor light emitting structure, separated from the growth substrate, on a temporary substrate is performed.

An assembly substrate provided with wiring electrodes, assembly electrodes, assembly recesses, etc. is prepared (S1320). Specifically, the preparation of the assembly substrate (S1320) may include forming the wiring electrodes on the substrate, forming a dielectric film configured to surround the wiring electrodes, forming the assembly electrodes on the dielectric film, forming an assembly insulating film configured to surround the assembly electrodes, and forming a partition wall configured to define the assembly recesses on the assembly insulating film.

The above assembly substrate differs from an assembly substrate on which horizontal semiconductor light emitting elements are assembled in that the wiring electrodes are located under the assembly recesses. The wiring electrodes are formed in advance on the assembly substrate so that each of the wiring electrodes is electrically connected to the conductivity-type electrode formed at one end of a corresponding one of the semiconductor light emitting elements. Further, stepped parts including the dielectric film and the assembly insulating film are provided on the wiring electrodes. The stepped parts are located under the assembly recesses. Therefore, when in case that the semiconductor light emitting elements are assembled with the assembly recesses, the semiconductor light emitting elements come into contact with the stepped parts located under the assembly recesses.

Thereafter, the self-assembly process is performed in the same manner as the self-assembly process of the general horizontal semiconductor light emitting element.

That is, the semiconductor light emitting elements are put into a chamber filled with fluid, and the assembly substrate is located in the chamber (S1330). Then, the semiconductor light emitting elements are assembled on the assembly substrate using a magnetic field and an electric field (S1340).

When the assembly process has been completed, the assembly substrate on which the semiconductor light emitting elements are assembled is separated from the fluid, and a laser is radiated to the wiring electrodes on the assembly substrate (S1350). The assembly substrate is formed of a material which transmits the laser, and the laser is radiated to the rear surface of the assembly substrate rather than the surface of the assembly substrate on which the semiconductor light emitting elements are assembled.

Therefore, the laser penetrates the assembly substrate and then reaches the wiring electrodes, and the wiring electrodes, to which the laser is radiated, may be heated by the laser, and may thus be melted. Therefore, the laser should have sufficient energy to melt the wiring electrodes, and the wiring electrodes need to be formed of a low melting point metal which may be melted by the laser. For example, the laser may have a wavelength of 1024 nm or less, and the wiring electrodes may be formed of Al or Ag. Further, the entire wiring electrodes do not have to be formed of Al or Ag, and the low melting point metal may be added to a point of each wiring electrode which is melted by the laser radiated thereto.

The wiring electrode melted by the laser is electrically connected to the conductivity-type electrode formed at one end of the semiconductor light emitting element (S1360). As will be described later, the surface layer of the conductivity-type electrode connected to the wiring electrode has an uneven structure, thereby being capable of increasing a contact area with the wiring electrode. Further, when the wiring electrode is melted and thus comes into contact with the conductivity-type electrode of the semiconductor light emitting element, a part of the wiring electrode may form a protrusion structure protruding towards the assembly recess. Further, the lower portion of the wiring electrode may have a depression structure so as to correspond to the protruding extent of the protrusion structure. Further, the lower portion of the depression structure may be separated from the substrate, and thereby, a void may be formed.

It will be apparent to those skilled in the art that omission of or changes in some operations in the flowchart shown in FIG. 13 are included in the scope of the present disclosure, with respect to the overall gist of the present disclosure.

Figure 14:
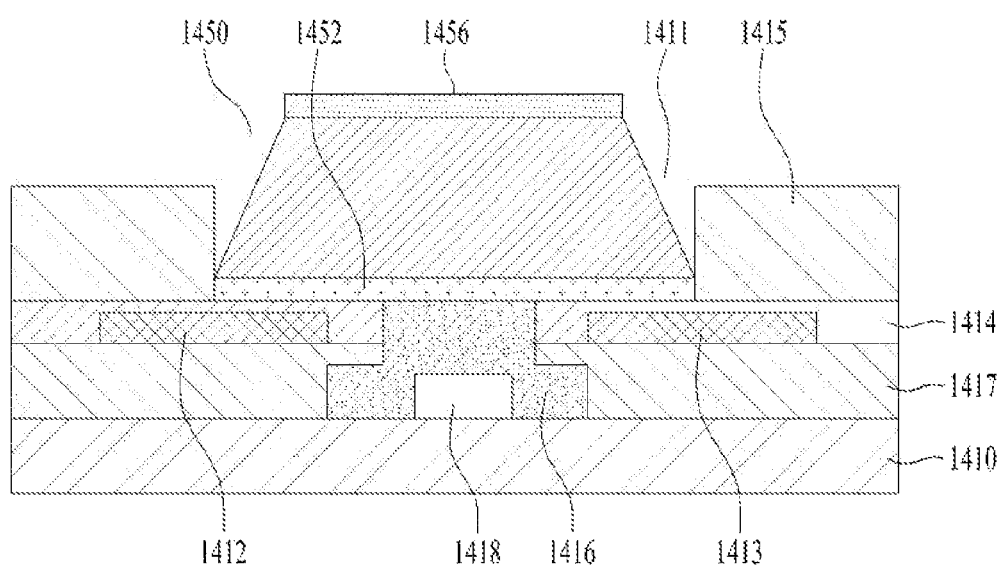
FIG. 14 is a cross-sectional diagram of a vertical semiconductor light emitting element electrically connected to a wiring electrode under an assembly recess.

FIG. 14 is a cross-sectional diagram of a vertical semiconductor light emitting element electrically connected to a wiring electrode under an assembly recess.

As shown in FIG. 14, when the self-assembly process has been completed, a semiconductor light emitting element 1450 is located in an assembly recess 1411 of an assembly substrate. The assembly substrate is configured such that a wiring electrode 1416 is formed on a substrate 1410 and a dielectric film 1417 is provided to protect the wiring electrode 1416.

Further, assembly electrodes 1412 and 1413 configured to generate DEP force, an assembly insulating film 1414 configured to protect the assembly electrodes 1412 and 1413, and a partition wall 1415 configured to form the assembly recess 1411 are formed on the dielectric film 1417.

Further, the semiconductor light emitting element 1450 has a vertical semiconductor light emitting structure, a first conductivity-type electrode 1452 connected to a first conductivity-type semiconductor layer is located at one end of the semiconductor light emitting element 1450, and a second conductivity-type electrode 1456 connected to a second conductivity-type semiconductor layer is located at the other end of the semiconductor light emitting element 1450. The first conductivity-type semiconductor layer or the second conductivity-type semiconductor layer may be an N-type or P-type semiconductor layer, and an active layer is disposed between the semiconductor layers.

Further, the cross-sectional diagram shown in FIG. 14 illustrates the semiconductor light emitting element 1450 in which the laser process has been completed after assembly of the semiconductor light emitting element 1450 on the assembly substrate, and thus, the wiring electrode 1416 is in the state in which the shape thereof is deformed. That is, a protrusion protruding towards the assembly recess 1411 is formed in a region of the wiring electrode 1416, and a depression is formed in the other surface of the wiring electrode 1416 opposite to the protrusion so as to correspond to the protrusion. The depression may not come into contact with the substrate 1410, and thereby, a void 1418 may be formed.

Figure 15:
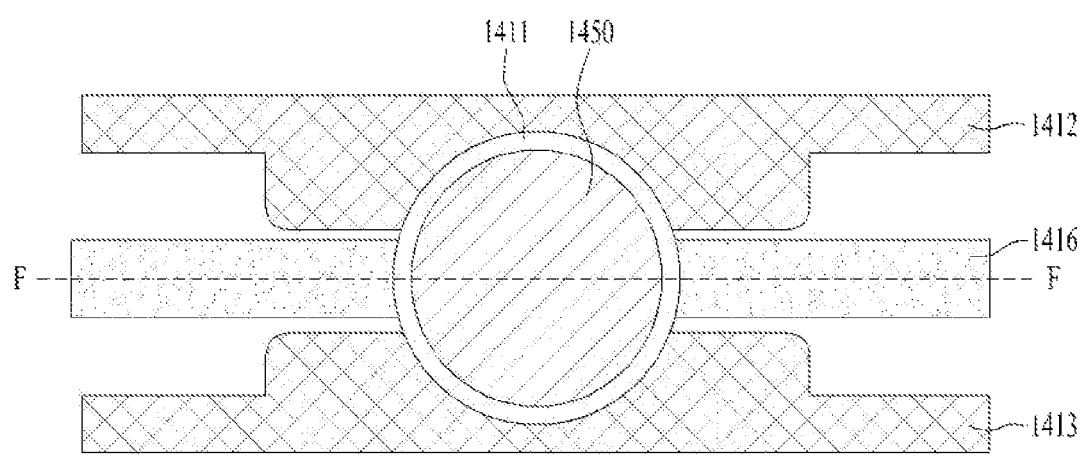
FIG. 15 is a plan view of the semiconductor light emitting element shown in FIG. 14.

FIG. 15 is a plan view of the semiconductor light emitting element shown in FIG. 14.

More specifically, FIG. 15 is a plan view in which the shapes of the dielectric film, the assembly insulating film and the partition wall are removed in order to clearly represent the shapes and positions of the assembly electrodes 1412 and 1413 and the wiring electrode 1416.

In general, the semiconductor light emitting element 1450 may have a circular shape in order to improve assembly speed, and may be formed to have a slightly smaller size than the width of the assembly recess 1411. Further, the assembly electrodes 1412 and 1413 may be provided in a pair, and some regions thereof may overlap the partition wall. Remaining regions of the assembly electrodes 1412 and 1413 not overlapping the partition wall may overlap the assembly recess 1411.

Further, the wiring electrode 1416 may overlap the center of the assembly recess 1411 while passing through the center of the assembly recess 1411. The assembly electrodes 1412 and 1413 and the wiring electrode 1416 may be provided in a bar type, and the assembly electrodes 1412 and 1413 and the wiring electrode 1416 may be formed parallel to each other in a direction of the long axes of the bar-type electrodes.

Figure 16:
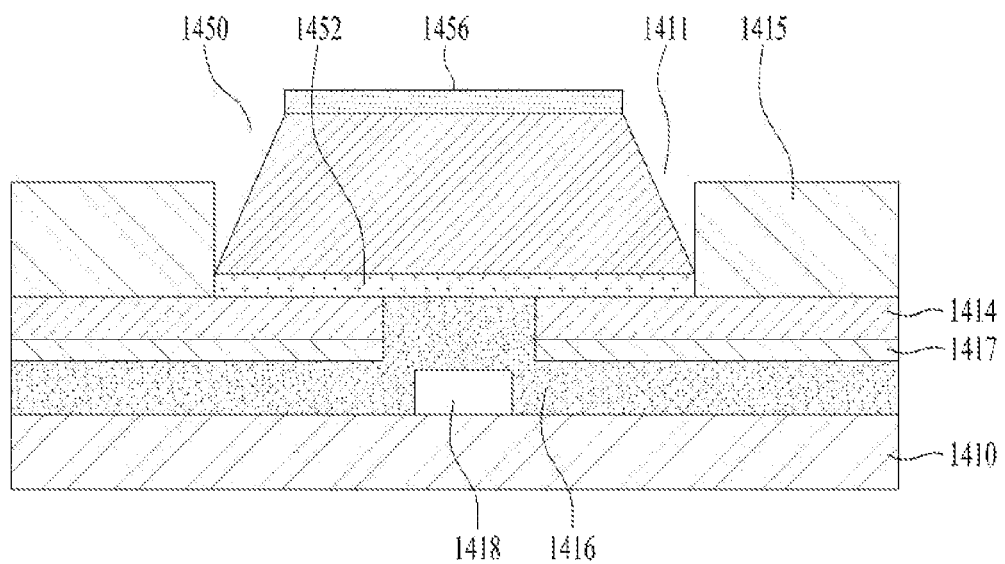
FIG. 16 is a cross-sectional diagram of the semiconductor light emitting element, taken along line F-F in FIG. 15.

FIG. 16 is a cross-sectional diagram of the semiconductor light emitting element, taken along line F-F in FIG. 15.

FIG. 14 is a cross-sectional diagram taken along a line perpendicular to line F-F of the semiconductor light emitting element shown in FIG. 15, and thus, the assembly electrodes are observed in the cross-sectional diagram of FIG. 14. On the other hand, FIG. 16 is a cross-sectional view taken along line F-F in FIG. 15, and thus, the assembly electrodes are not observed. However, the shapes of the wiring electrode 1416 and stepped parts formed under the assembly recess 1411 may be confirmed in more detail.

As shown in FIG. 16, when the self-assembly process has been completed, the semiconductor light emitting element 1450 is located in the assembly recess 1411 of the assembly substrate. The assembly substrate is configured such that the wiring electrode 1416 is formed on the substrate 1410 and the dielectric film 1417 is provided to protect the wiring electrode 1416.

Further, the assembly insulating film 1414 is located on the dielectric film 1417, and the partition wall 1415 configured to form the assembly recess 1411 is formed on the assembly insulating film 1414.

Although the assembly electrodes are disposed between the dielectric film 1417 and the assembly insulating film 1414, the assembly electrodes are not observed in the cutting direction of FIG. 16. Further, parts of the dielectric film 1417 and the assembly insulating film 1414, which are located under the assembly recess 1411, are etched to form the stepped parts, and the semiconductor light emitting element 1450 is located on the stepped parts. The semiconductor light emitting element 1450 has a vertical semiconductor light emitting structure having the first conductivity-type electrode 1452 formed at one end thereof and the second conductivity-type electrode 1456 formed at the other end thereof.

The cross-sectional diagram shown in FIG. 16 illustrates the semiconductor light emitting element 1450 in which the laser process has been completed after assembly of the semiconductor light emitting element 1450 on the assembly substrate, and thus, the wiring electrode 1416 is in the state in which the shape thereof is deformed. That is, the protrusion, which protrudes towards the assembly recess 1411 and thus overlaps the assembly recess 1411, is formed in a region of the long bar-type wiring electrode 1416 in which the dielectric film 1417 and the assembly insulating film 1414 are not located. Further, the depression is formed in the other surface of the wiring electrode opposite to the protrusion so as to correspond to the protrusion. The depression may not come into contact with the substrate 1410, and thereby, the void 1418 may be formed. Although this figure illustrates the void 1418 as being formed only between the wiring electrode 1416 and the substrate 1410, the void 1418 may be formed at various positions depending on the radiation angle, the radiation intensity and the radiation time of the laser.

Figure 17:
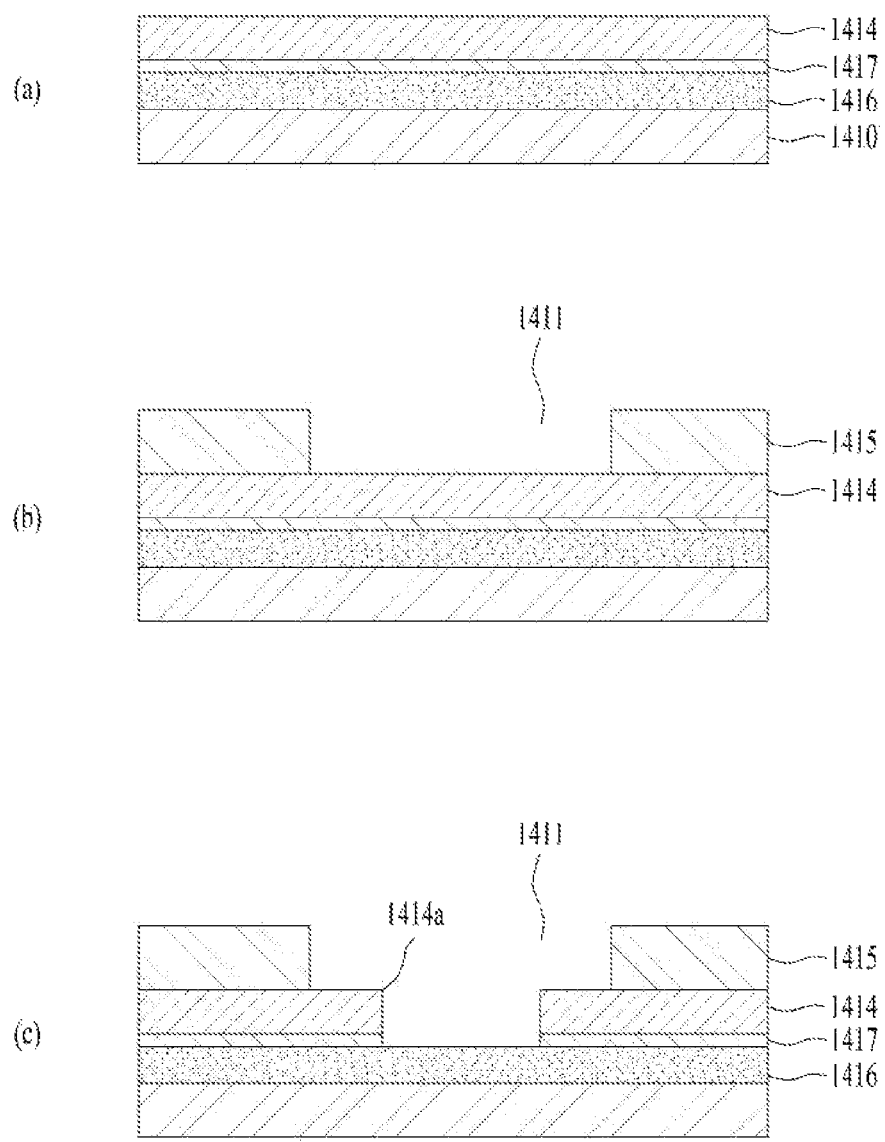
FIG. 17 shows cross-sectional diagrams representing a process of preparing an assembly substrate according to the present disclosure.

FIG. 17 shows cross-sectional diagrams representing a process of preparing the assembly substrate according to the present disclosure.

First, as shown in FIG. 17(*a*), the wiring electrode 1416, the dielectric film 1417 and the assembly insulating film 1414 are stacked on the substrate 1410. The assembly electrodes are formed between the dielectric film 1417 and the assembly insulating film 1414, but are not observed in the cutting direction of this cross-sectional diagram.

The substrate 1410 is formed of a material which may transmit the laser, and may thus be formed of a material having higher band gap energy than the intensity of the laser, such as glass. Further, the dielectric film 1417 and the assembly insulating film 1414 may be formed of a polymer having insulating properties so as to prevent current applied from the wiring electrode 1416 or the wiring electrodes from leaking to other regions.

Thereafter, as shown in FIG. 17(*b*), the assembly recess 1411 is defined by forming the partition wall 1415 on the assembly insulating film 1414. The partition wall 141 may be formed of a photosensitive material, such as photoresist, and the assembly recesses 1411 may be formed at a designated distance through a photolithography process. The assembly recess 1411 is a region in which a semiconductor light emitting element is assembled, and may form a respective unit pixel in a display device.

Thereafter, as shown in FIG. 17(*c*), stepped parts 1414a are formed under the assembly recesses 1411 defined by the partition wall 1415. The stepped parts may be formed by etching some parts of the dielectric film 1417 and the assembly insulating film 1414 located on the wiring electrode 1416. As shown in the cross-sectional diagram shown in FIG. 17(*c*), the stepped parts 1414a may be formed under both ends of the assembly recess 1411, or the stepped part 1414a may be formed in a circular shape along the circumference of the lower part of the assembly recess 1411, in case that the assembly recess 1411 is circular.

Further, a distance between the stepped parts 1414a formed under the assembly recess 144 shown in FIG. 17(*c*) may be smaller than the width of the assembly surface of a semiconductor light emitting element. Thereby, when the semiconductor light emitting element is assembled with the assembly recess, the assembly surface of the semiconductor light emitting element comes into contact with the upper surfaces of the stepped part 1414a. Further, the stepped parts 1414a are formed by etching some parts of the dielectric film 1417 and the assembly insulating film 1414, and thus have the same thickness, and thereby, the semiconductor light emitting element placed on the stepped parts 1414a may maintain level inside the assembly recess 1411 without being inclined Further, the stepped parts 1414*a* facilitate a subsequent process of connecting the wiring electrode 1416 to the semiconductor light emitting element by radiating a laser to the wiring electrode 1416. For example, in case that a dielectric film and an assembly insulating film are located on the upper surface of a wiring electrode not provided with stepped part to which a laser is radiated, the wiring electrode should penetrate the dielectric film and the assembly insulating film. During such a process, an excessively high intensity of the laser may be required, and thereby, the laser may damage the structure of an assembly substrate.

However, as shown in FIG. 17(*c*), a space formed between the stepped parts 1414*a* serves as a space in which the wiring electrode melted by the laser may be connected to the semiconductor light emitting element, thereby being capable of preventing such a problem.

Figure 18:
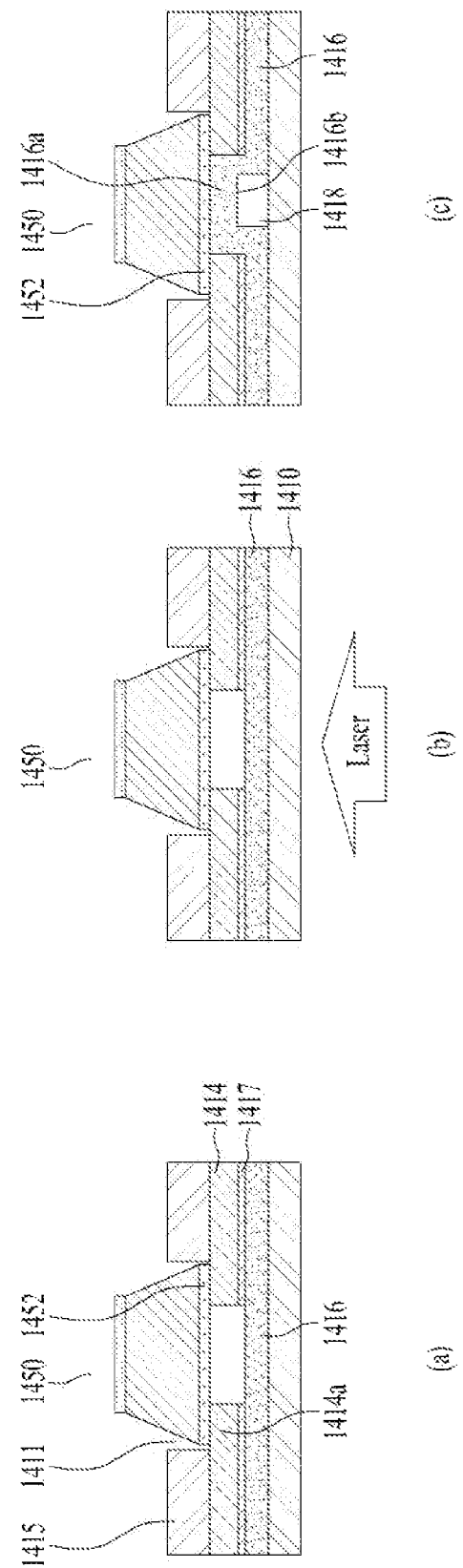
FIG. 18 shows cross-sectional diagrams representing a process of assembling the vertical semiconductor light emitting element on the assembly substrate according to the present disclosure and subsequently performing a wiring process.

FIG. 18 shows cross-sectional diagrams representing a process of assembling the vertical semiconductor light emitting element on the assembly substrate according to the present disclosure and subsequently performing the wiring process.

As shown in FIG. 18(*a*), the semiconductor light emitting element 1450 is placed on the upper surfaces of the stepped parts 1414*a* located under the assembly recess 1411. The semiconductor light emitting element 1450 has a vertical structure, and thus, the regions thereof coming into contact with the stepped parts 1414*a* correspond to the conductivity-type electrode 1452 formed at one end of the semiconductor light emitting element 1450.

Further, the assembly recess 1411 is defined by the partition wall 1415, and the stepped parts 1414*a* are formed by etching some parts of the assembly insulating film 1414 and the dielectric film 1417. More specifically, the stepped parts 1414*a* protrude towards the assembly recess 1411 farther than the partition wall 1415, and thus form a stepped structures. That is, the stepped structures are formed to be located in a direction from the partition wall 1415 towards the inside of the assembly recess 1411. The space formed between the stepped parts 1414*a* is empty, and the wiring electrode 1416 is exposed towards the space from below. The assembly electrodes for self-assembly are located between the assembly insulating film 1414 and the dielectric film 1417, but are not observed in this cross-sectional diagram.

When the semiconductor light emitting element 1450 is assembled on the assembly substrate, a laser is radiated to the wiring electrode 1416, as shown in FIG. 18(*b*). Here, the laser is radiated to the rear surface of the substrate 1410 on which the semiconductor light emitting element 1450 is not assembled. The substrate 1410 is formed of a material which transmits the laser, and the laser transmitted by the substrate 1410 is converted into thermal energy in the wiring electrode 1416. More specifically, the laser is radiated to the position of the space between the stepped parts of the assembly recess in which the semiconductor light emitting element 1450 is located. The laser is radiated to a partial region of the wiring electrode 1416 overlapping the space between the stepped parts, and thereby, the corresponding region may be heated and melted.

Thereafter, as shown in FIG. 18(*c*), the molten wiring electrode 1416 protrudes towards the space between the stepped parts, and may thus be electrically connected to the conductivity-type electrode 1452 of the semiconductor light emitting element 1450. A part of the wiring electrode 1416 may form a protrusion 1416*a* electrically connected to the semiconductor light emitting element 1450, as shown in FIG. 18(*c*), and a depression 1416*b* may be formed in the other surface of the wiring electrode opposite to the protrusion 1416*a* so as to correspond to the protrusion 1416*a*. Further, the depression 1416*b* may be spaced apart from the substrate, and thereby, the void 1418 may be provided. In case that the intensity of the laser is sufficiently high and the space between the stepped parts is narrow, the protrusion 1416*a* of the wiring electrode 1416 may come into direct contact with the side surfaces of the stepped parts, as shown in FIG. 18(*c*).

In addition, an insulating layer may be applied to the upper surface of the assembly substrate on which the semiconductor light emitting element 1450 is assembled, and the photolithography process and the additional wiring process may be performed. Here, the wiring process may indicate a process in which a wiring electrode is formed on the conductivity-type electrode of the semiconductor light emitting element exposed from the upper surface of the substrate when the semiconductor light emitting element is assembled on the substrate.

Figure 19:
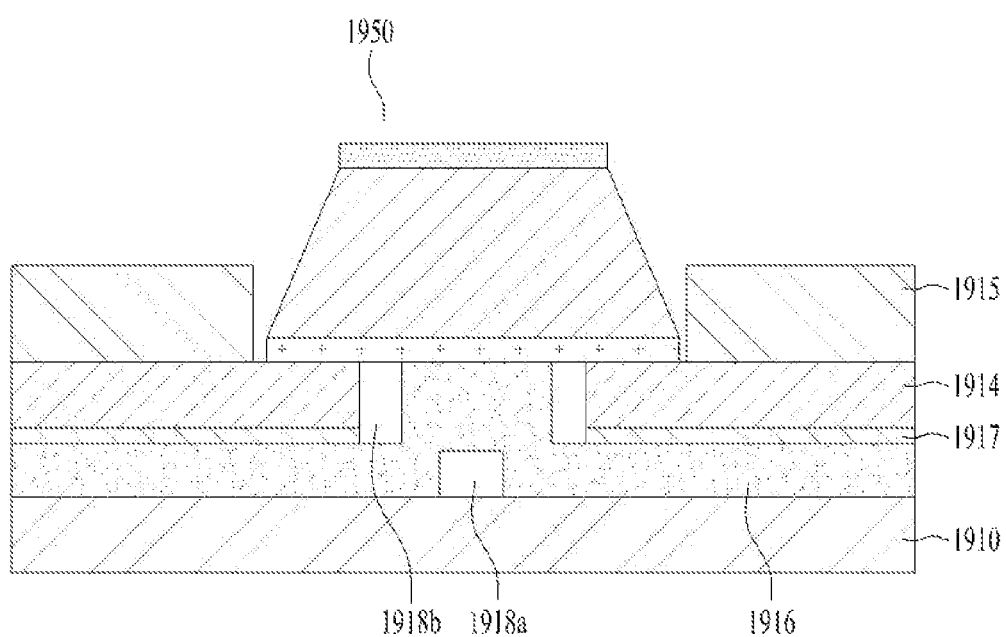
FIG. 19 is a cross-sectional diagram illustrating a semiconductor light emitting element according to another embodiment of the present disclosure in which the wiring process has been performed.

FIG. 19 is a cross-sectional diagram illustrating a semiconductor light emitting element according to another embodiment of the present disclosure in which the wiring process has been performed.

FIG. 18 illustrates the structure in which the void is formed only under the wiring electrode, but FIG. 19 illustrates that voids 1918*a* and 1918*b* may be formed at other positions.

As described above, an assembly substrate is formed by sequentially stacking a substrate 1910, a wiring substrate 1916, a dielectric film 1917, an assembly insulating film 1914 and a partition wall 1915. A semiconductor light emitting element 1950 is assembled on the assembly substrate through the self-assembly process, and thereafter, the wiring process is performed on the wiring electrode 1916 and the semiconductor light emitting element 1950 by radiating a laser.

A protrusion electrically connected to the semiconductor light emitting element 1450 may be formed at a part of the wiring electrode 1416, and a depression may be formed in the other surface of the wiring electrode opposite to the protrusion so as to correspond to the protrusion, as described above with reference to FIG. 18.

The main object of the wiring process is to electrically connect the semiconductor light emitting element 1950 to the wiring electrode 1916, and the present disclosure does not limit the detailed shape of the wiring electrode 1916. For example, the wiring electrode 1916 may be configured to protrude towards the semiconductor light emitting element 1950 so as to be connected to the semiconductor light emitting element 1950, but the side surface of the protruding wiring electrode 1916 may not maintain the vertical structure, as shown in FIG. 19. Further, voids formed by connecting the wiring electrode 1916 to the semiconductor light emitting element 1950 may be formed between the wiring electrode 1916 and the substrate 1910, or may be formed between the wiring electrode 1916 and the stepped parts of the dielectric film 1917 and the assembly insulating film 1914. Therefore, as shown in FIG. 19, a void 1918*a* may be formed between the wiring electrode 1916 and the substrate 1910, and voids 1918*b* may be formed between the wiring electrode 1916 and the stepped parts of the dielectric film 1917 and the assembly insulating film 1914.

As described above, the angle and the intensity of the laser radiated to the wiring electrode 1416, the distance between the stepped parts, the melting characteristics of the wiring electrode, etc. may influence the shape of the protrusion of the wiring electrode.

Figure 20:
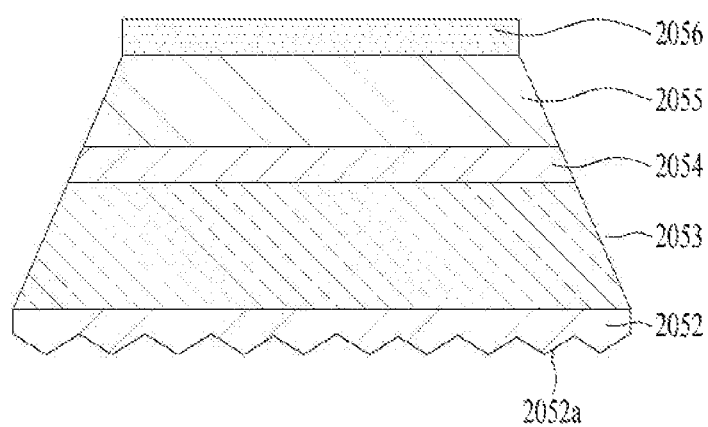
FIG. 20 is a cross-sectional diagram illustrating the structure of a vertical semiconductor light emitting element according to the present disclosure configured to more easily perform the wiring process.

FIG. 20 is a cross-sectional diagram illustrating the structure of a vertical semiconductor light emitting element according to the present disclosure configured to more easily perform the wiring process.

In case that a conductivity-type electrode is formed on one surface of a semiconductor light emitting element electrically connected to a wiring electrode and the surface of the conductivity-type electrode has an uneven structure, a contact area between the the conductivity-type electrode and the wiring electrode may be increased.

As shown in FIG. 20, the vertical semiconductor light emitting element according to the present disclosure may include a first conductivity-type electrode 2052 provided with an uneven structure 2052a, a first conductivity-type semiconductor layer 2053, an active layer 2054, a first conductivity semiconductor layer 2055 and a second conductivity-type electrode 2056. In addition, in order to protect the semiconductor light emitting element, a passivation layer may be formed on the outer surface of the element.

In general, in case of a horizontal semiconductor light emitting element, the wiring process is performed in one direction in which the element assembled on a substrate is exposed. Therefore, since a first conductivity-type electrode and a second conductivity-type electrode are connected to wiring electrodes in one direction, there is risk of a short defect due to decrease in a distance between the electrodes.

However, in case of a vertical semiconductor light emitting element, conductivity-type electrodes are formed at both ends of the element, and thus, a possibility of occurrence of a short defect between the electrodes is remarkably low compared to the horizontal semiconductor light emitting element. However, when the wiring process is performed on the conductivity-type electrode formed at one end of the semiconductor light emitting element, which is not exposed, after assembly of the semiconductor light emitting element on a substrate, there is a great possibility of occurrence of an open defect.

However, as shown in FIG. 20, when the uneven structure 2052a is formed on one surface of the semiconductor light emitting element assembled on the assembly substrate so as to increase a contact area between the corresponding conductivity-type electrode surface and the assembly substrate, such a possibility of occurrence of an open defect may be greatly reduced. However, the present disclosure is not limited to the uneven structure 2052a formed on the entire surface of the first conductivity-type semiconductor layer 2053 shown in FIG. 20. For example, an uneven structure may be provided on a partial region of a conductivity-type electrode of the semiconductor light emitting element which does not come into contact with the stepped parts of the assembly recess, and the remaining region of the conductivity-type electrode which comes into contact with the stepped parts may have an even structure.

Figure 21:
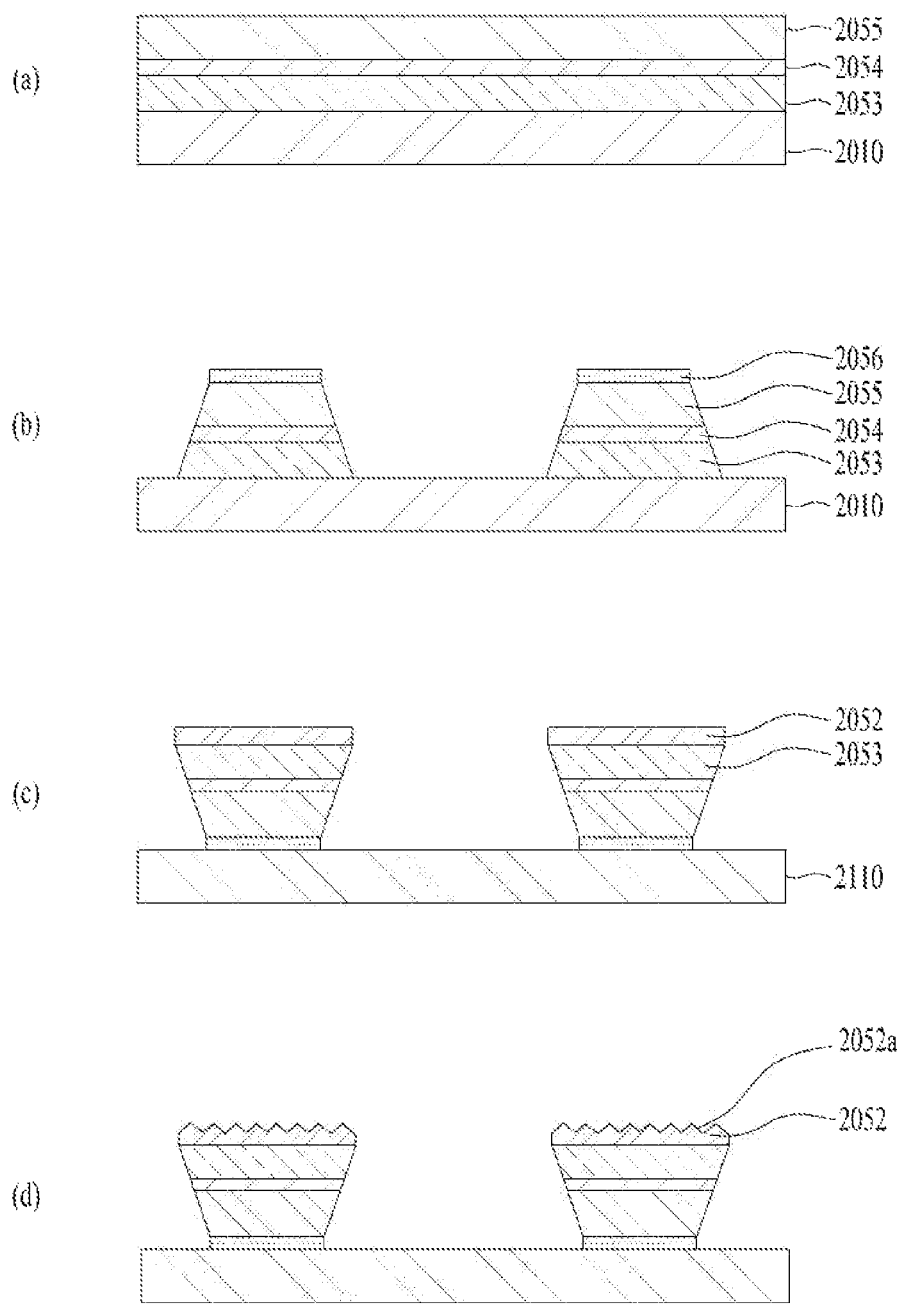
FIG. 21 shows cross-sectional diagrams illustrating a process of manufacturing the semiconductor light emitting element shown in FIG. 20.

FIG. 21 shows cross-sectional diagrams illustrating a process of manufacturing the semiconductor light emitting element shown in FIG. 20.

First, as shown in FIG. 21(a), a stack structure is formed by sequentially stacking the first conductivity-type semiconductor layer 2053, the active layer 2054 and the second conductivity-type semiconductor layer 2055 on a growth substrate 2010.

Thereafter, as shown in FIG. 21(b), the stack structure is deformed into a metal structure using photolithography and etching processes, and the second conductivity-type electrode 2056 is formed on the second conductivity-type semiconductor layer 2055. Therefore, a semiconductor light emitting structure includes the first conductivity-type semiconductor layer 2053, the active layer 2054, the second conductivity-type semiconductor layer 2055 and the second conductivity-type electrode 2056, which are sequentially stacked on the growth substrate 2010.

Thereafter, in order to implement the vertical semiconductor light emitting element, the semiconductor light emitting structure is transferred from the growth substrate to a temporary substrate.

FIG. 21(c) illustrates the semiconductor light emitting structure transferred to the temporary substrate 2110. In order to form the first conductivity-type electrode 2052 on the first conductivity-type semiconductor layer 2053 of the semiconductor light emitting structure, the semiconductor light emitting structure is transferred so as to be flipped over. That is, the second conductivity-type electrode 2056 comes into contact with the temporary substrate 2110.

Thereafter, as shown in FIG. 21(d), the etching process for forming the uneven structure on the surface of the first conductivity-type electrode 2052 is performed. During the etching process, wet etching using chemicals or dry etching using plasma ions or the like may be performed. Further, in order to etch some parts other than the entire surface of the first conductivity-type electrode, the photolithography process may be performed in advance on the first conductivity-type semiconductor layer 2053 before the etching process.

In addition, the semiconductor light emitting element provided with the uneven structure is separated from the temporary substrate and is put into fluid so as to perform self-assembly.

The above description is merely illustrative of the technical idea of the present disclosure. Those of ordinary skill in the art to which the present disclosure pertains will be able to make various modifications and variations without departing from the essential characteristics of the present disclosure.

Therefore, embodiments disclosed in the present disclosure are not intended to limit the technical idea of the present disclosure, but to describe, and the scope of the technical idea of the present disclosure is not limited by such embodiments.

The scope of protection of the present disclosure should be interpreted by the claims below, and all technical ideas within the scope equivalent thereto should be construed as being included in the scope of the present disclosure.

What is claimed is:

1. A display device comprising:
   a substrate;
   a wiring electrode located on the substrate;
   a dielectric film located on the wiring electrode;
   assembly electrodes located on the dielectric film;
   an assembly insulating film located on the assembly electrodes;
   partition walls located on the assembly insulating film so as to define an assembly recess therebetween, wherein the assembly recess is configured to accommodate a semiconductor light emitting element assembled therein; and
   the semiconductor light emitting element provided with conductivity-type electrodes formed at both ends thereof,
   wherein the wiring electrode comprises a protrusion which protrudes towards the assembly recess and is electrically connected to one of the conductivity-type electrodes of the semiconductor light emitting element.

2. The display device of claim 1, wherein the wiring electrode comprises a depressed portion formed opposite the protrusion.

3. The display device of claim 2, wherein:
the assembly electrodes are provided in a pair and a position of each assembly electrode overlaps with a position of a corresponding partition wall; and
a position of the wiring electrode corresponds to a center of the assembly recess.

4. The display device of claim 3, wherein the wiring electrode and the assembly electrodes are elongated and formed parallel to each other.

5. The display device of claim 4, further comprising stepped parts located under the assembly recess, wherein the semiconductor light emitting element is positioned on top of the stepped parts.

6. The display device of claim 5, wherein the stepped parts are formed by etching a portion of the dielectric film and the assembly insulating film exposed between the partition walls.

7. The display device of claim 6, wherein the protrusion of the wiring electrode is formed in a space defined between the stepped parts.

8. The display device of claim 1, wherein a surface of the conductivity-type electrode of the semiconductor light emitting element connected to the protrusion of the wiring electrode is provided with an uneven structure.

9. The display device of claim 1, wherein the semiconductor light emitting element is provided with a magnetic layer.

10. The display device of claim 1, wherein the semiconductor light emitting element is a micro-LED having a size measured in micrometers.

11. A method for manufacturing a display device, the method comprising:
forming a semiconductor light emitting element provided with a magnetic layer;
preparing an assembly substrate comprising a wiring electrode, assembly electrodes, and an assembly recess;
placing the semiconductor light emitting element into a chamber filled with a fluid;
positioning the assembly substrate at an upper region of the chamber, and causing the semiconductor light emitting element to be assembled within the assembly recess of the assembly substrate using a magnetic field and an electric field;
radiating a laser to affect a region of the wiring electrode of the assembly substrate; and
electrically connecting the affected region of the wiring electrode to the semiconductor light emitting element.

12. The method of claim 11, wherein preparing the assembly substrate comprises:
forming the wiring electrode on the assembly substrate;
forming a dielectric film configured to surround the wiring electrode;
forming the assembly electrodes on the dielectric film;
forming an assembly insulating film configured to surround the assembly electrodes; and
forming partition walls on the assembly insulating film so as to define the assembly recess therebetween.

13. The method of claim 12, wherein preparing the assembly substrate further comprises forming stepped parts under the assembly recess by etching a portion of the assembly insulating film and the dielectric film exposed between the partition walls.

14. The method of claim 13, wherein the semiconductor light emitting element is assembled within the assembly recess by being disposed on top of the stepped parts.

15. The method of claim 11, wherein:
the assembly substrate is formed of a material configured to transmit the laser; and
the laser is radiated through a rear surface of the assembly substrate toward the region of the wiring electrode which corresponds to a position of the assembly recess.

16. The method of claim 11, wherein the semiconductor light emitting element has a vertical semiconductor light emitting structure and is provided with conductivity-type electrodes provided at both ends thereof,
wherein an uneven structure is provided on a surface of at least one of the conductivity-type electrodes provided at both ends of the vertical semiconductor light emitting structure.

* * * * *